United States Patent
Hinode

(10) Patent No.: US 10,854,469 B2
(45) Date of Patent: Dec. 1, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventor: Taiki Hinode, Kyoto (JP)

(73) Assignee: SCREEN Holdings Co., Ltd.

( * ) Notice: Subject to any disclaimer, the term of this patent is extended or adjusted under 35 U.S.C. 154(b) by 101 days.

(21) Appl. No.: 15/950,557

(22) Filed: Apr. 11, 2018

(65) Prior Publication Data

US 2018/0308706 A1  Oct. 25, 2018

(30) Foreign Application Priority Data

Apr. 20, 2017  (JP) .................................. 2017-083934

(51) Int. Cl.
| | |
|---|---|
| H01L 21/311 | (2006.01) |
| H01L 21/687 | (2006.01) |
| H01L 21/67 | (2006.01) |
| G05D 11/00 | (2006.01) |
| H01L 21/66 | (2006.01) |

(52) U.S. Cl.
CPC ........ *H01L 21/31111* (2013.01); *G05D 11/00* (2013.01); *H01L 21/6708* (2013.01); *H01L 21/67017* (2013.01); *H01L 21/67253* (2013.01); *H01L 21/68764* (2013.01); *H01L 22/26* (2013.01)

(58) Field of Classification Search
None
See application file for complete search history.

(56) References Cited

U.S. PATENT DOCUMENTS

| | | | | | |
|---|---|---|---|---|---|
| 5,456,795 | A | * | 10/1995 | Danjo | ................... C04B 41/009 216/101 |
| 6,001,215 | A | * | 12/1999 | Ban | ................... H01L 21/67086 156/345.15 |
| 6,780,277 | B2 | * | 8/2004 | Yokomizo | ......... H01L 21/31111 156/345.11 |
| 7,635,397 | B2 | * | 12/2009 | Okuchi | ............. H01L 21/67086 29/25.01 |

(Continued)

FOREIGN PATENT DOCUMENTS

| | | |
|---|---|---|
| CN | 104716022 A | 6/2015 |
| JP | 11-279777 A | 10/1999 |

(Continued)

*Primary Examiner* — Allan W. Olsen
(74) *Attorney, Agent, or Firm* — Ostrolenk Faber LLP

(57) ABSTRACT

When a silicon concentration of a phosphoric acid aqueous solution inside a tank reaches an upper limit value of a specified concentration range, the phosphoric acid aqueous solution is drawn off from the tank and/or an amount of the phosphoric acid aqueous solution returning to the tank is decreased to decrease a liquid amount inside the tank to a value not more than a lower limit value of a specified liquid amount range. When the liquid amount inside the tank decreases to the value not more than the lower limit value of the specified liquid amount range, the phosphoric acid aqueous solution is replenished to the tank to increase the liquid amount inside the tank to a value within the specified liquid amount range and decrease the silicon concentration of the phosphoric acid aqueous solution inside the tank to a value within the specified concentration range.

4 Claims, 8 Drawing Sheets

(56) References Cited

U.S. PATENT DOCUMENTS

| | | | | |
|---|---|---|---|---|
| 8,008,087 B1* | 8/2011 | Shalyt | G01N 27/4166 |
| | | | 436/72 |
| 8,105,851 B1* | 1/2012 | Ku | H01L 21/31111 |
| | | | 134/109 |
| 8,298,435 B2* | 10/2012 | Arndt | C09K 13/04 |
| | | | 216/84 |
| 8,580,133 B2* | 11/2013 | Reimer | H01L 21/67086 |
| | | | 216/83 |
| 9,852,921 B2* | 12/2017 | Kim | H01L 21/31111 |
| 2005/0067101 A1 | 3/2005 | Funabashi | 156/345.18 |
| 2005/0230045 A1* | 10/2005 | Okuchi | H01L 21/31111 |
| | | | 156/345.18 |
| 2007/0070803 A1* | 3/2007 | Urquhart | B01F 15/00207 |
| | | | 366/152.4 |
| 2008/0035609 A1* | 2/2008 | Kashkoush | H01L 21/31111 |
| | | | 216/84 |
| 2008/0179293 A1* | 7/2008 | Wei | H01L 21/31111 |
| | | | 216/84 |
| 2009/0049653 A1* | 2/2009 | Watanabe | B01D 9/0063 |
| | | | 23/295 R |
| 2009/0141583 A1* | 6/2009 | Fanjat | G05D 11/133 |
| | | | 366/140 |
| 2009/0189068 A1* | 7/2009 | Saini | B01J 41/07 |
| | | | 250/282 |
| 2011/0315228 A1* | 12/2011 | Yokota | B01F 5/0644 |
| | | | 137/1 |
| 2013/0255882 A1 | 10/2013 | Takahashi et al. | 15/345.15 |
| 2014/0290859 A1* | 10/2014 | Kobayashi | H01L 21/6708 |
| | | | 156/345.15 |
| 2015/0093906 A1* | 4/2015 | Kobayashi | H01L 21/31111 |
| | | | 438/748 |
| 2015/0118785 A1* | 4/2015 | Kashkoush | H01L 21/67086 |
| | | | 438/71 |
| 2015/0162224 A1 | 6/2015 | Hinode et al. | |
| 2015/0262737 A1 | 9/2015 | Hinode et al. | |
| 2016/0035597 A1 | 2/2016 | Hinode et al. | |
| 2016/0049308 A1 | 2/2016 | Hinode et al. | |
| 2017/0287725 A1* | 10/2017 | Rotondaro | C09K 13/08 |
| 2018/0096855 A1* | 4/2018 | Sato | H01L 21/31111 |
| 2018/0218924 A1* | 8/2018 | Tanaka | H01L 21/67313 |

FOREIGN PATENT DOCUMENTS

| | | |
|---|---|---|
| JP | 2005-79212 A | 3/2005 |
| JP | 2009-206419 A | 9/2009 |
| JP | 2014-090078 A | 5/2014 |
| JP | 2015-177139 A | 10/2015 |
| JP | 2016-032029 A | 3/2016 |
| JP | 2016-042503 A | 3/2016 |
| TW | 201340233 A | 10/2013 |

* cited by examiner

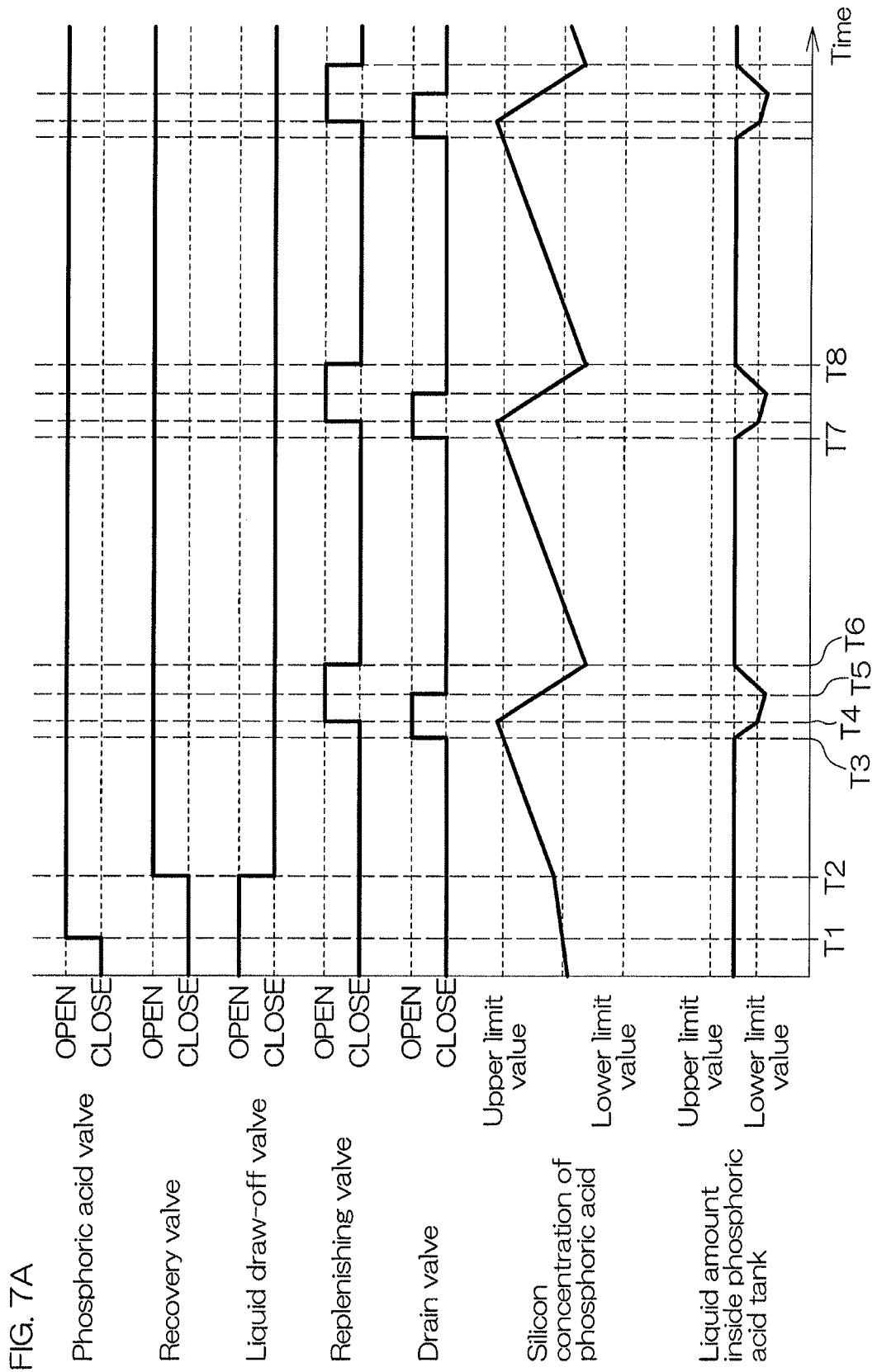

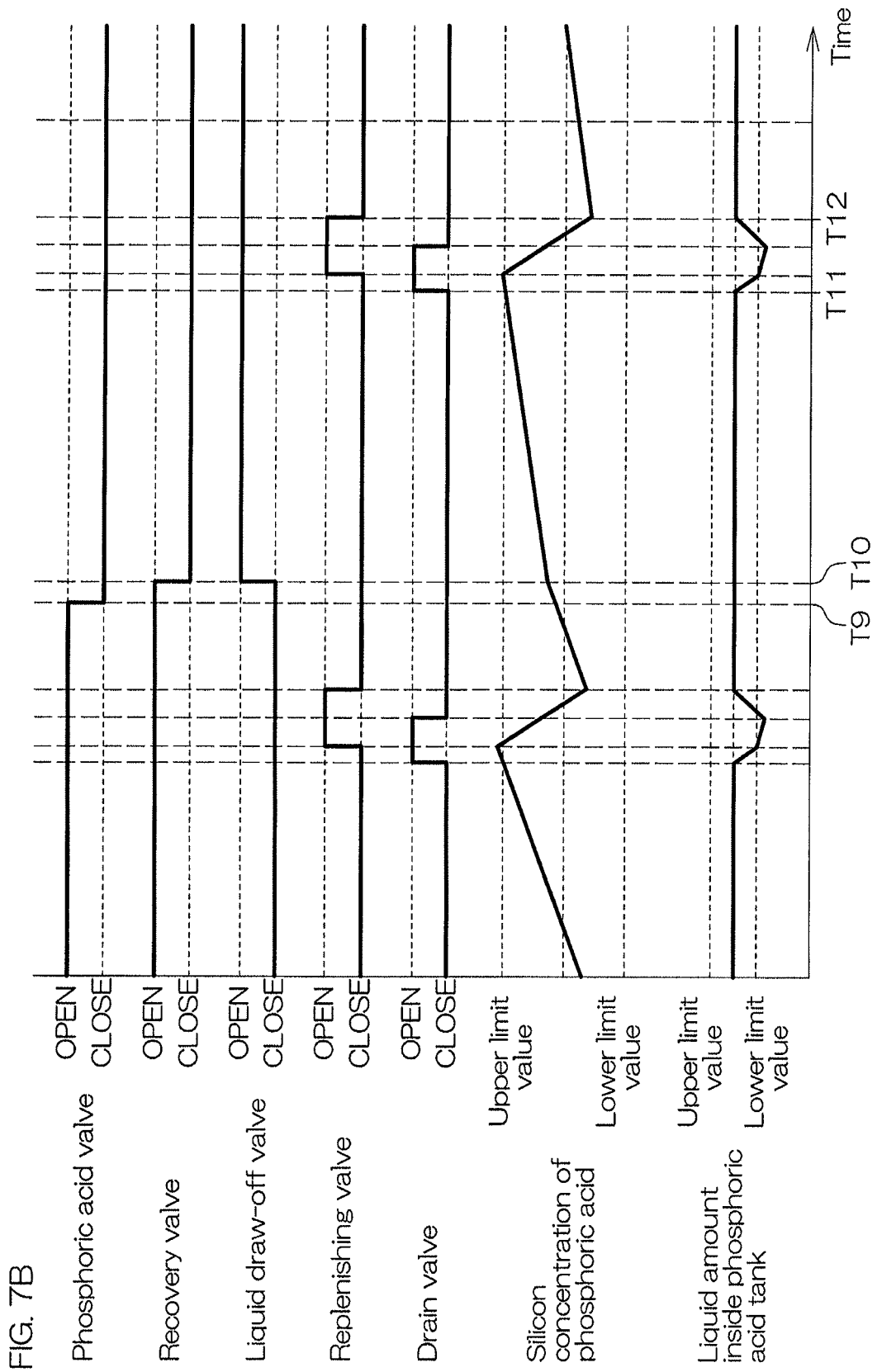

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus that process a substrate. Examples, of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In manufacturing processes for semiconductor devices and liquid crystal displays, substrate processing apparatuses are used for processing substrates such as semiconductor wafers or glass panels for liquid crystal displays. JP 2016-32029 A discloses a single substrate processing type substrate processing apparatus that processes substrates one by one.

The substrate processing apparatus includes a spin chuck that rotates a substrate while holding it horizontally, a processing liquid nozzle discharging a phosphoric acid aqueous solution toward the substrate held by the spin chuck, and a cup receiving the phosphoric acid aqueous solution spun off from the substrate. Phosphoric acid aqueous solutions to be supplied to the substrate are stored in a first tank, a second tank, and a third tank.

The first tank and the second tank store phosphoric acid aqueous solutions of a standard phosphoric acid concentration and a standard silicon concentration. The phosphoric acid aqueous solution inside the first tank is discharged from the processing liquid nozzle and supplied to the substrate. The phosphoric acid aqueous solution inside the second tank is replenished to the first tank. A liquid amount inside the first tank is thereby maintained constant. The phosphoric acid aqueous solution spun off from the substrate is received by the cup and guided to the third tank.

To replenish the phosphoric acid aqueous solution that could not be recovered to the third tank, a fresh phosphoric acid aqueous solution, adjusted to a predetermined phosphoric acid concentration, is supplied to the third tank. The total amount of the phosphoric acid aqueous solutions stored in the three tanks is thereby maintained constant. Further, the silicon concentration of the fresh phosphoric acid aqueous solution supplied to the third tank is adjusted such that the silicon concentration of the phosphoric acid aqueous solution inside the third tank would be the standard silicon concentration. When the phosphoric acid aqueous solution in the second tank becomes low, the phosphoric acid aqueous solution inside the third tank is replenished to the first tank and the phosphoric acid aqueous solution supplied to the substrate is recovered to the second tank.

SUMMARY OF THE INVENTION

In selective etching where a silicon nitride film is etched while suppressing etching of a silicon oxide film, it is important, in terms of stabilizing and improving selectivity (etching amount of the silicon nitride film/etching amount of the silicon oxide film), to maintain the concentration of silicon contained in the phosphoric acid aqueous solution within a specified concentration range.

On the other hand, with a single substrate processing type substrate processing apparatus, not all of the processing liquid supplied to the substrate can be recovered. This is because some of the processing liquid evaporate or remain on the substrate or the cup. With JP 2016-32029 A mentioned above, the fresh phosphoric acid aqueous solution is replenished to the second tank or the third tank to maintain constant the total amount of the phosphoric acid aqueous solutions stored in the three tanks. Further, the silicon concentration of the phosphoric acid aqueous solution to be replenished is changed to adjust the silicon concentration of the phosphoric acid aqueous solution inside the second tank or the third tank to the standard silicon concentration.

However, the prior art described above just replenishes the phosphoric acid aqueous solution of an amount corresponding to the phosphoric acid aqueous solution that could not be recovered and does not decrease the total phosphoric acid aqueous solution amount to urge replenishment of the phosphoric acid aqueous solution. Therefore, the prior art described above cannot intentionally change a phosphoric acid aqueous solution replenishing timing and a phosphoric acid aqueous solution replenishing amount.

A preferred embodiment of the present invention provides a substrate processing method that supplies a phosphoric acid aqueous solution containing silicon to a substrate including a front surface at which a silicon oxide film and a silicon nitride film are exposed to selectively etch the silicon nitride film and that includes a phosphoric acid storing step of storing the phosphoric acid aqueous solution, to be supplied to the substrate, in a phosphoric acid tank, a phosphoric acid guiding step of guiding the phosphoric acid aqueous solution from the phosphoric acid tank to a phosphoric acid nozzle, a phosphoric acid discharging step of making the phosphoric acid nozzle discharge the phosphoric acid aqueous solution toward the front surface of the substrate, a substrate rotating step of rotating the substrate around a vertical rotation axis, passing through a central portion of the substrate, while holding the substrate horizontally in parallel to the phosphoric acid discharging process, a phosphoric acid recovery step of recovering the phosphoric acid aqueous solution, which has been supplied to the substrate from the phosphoric acid nozzle, to the phosphoric acid tank by a phosphoric acid recovery unit, a concentration detecting step of detecting a silicon concentration of the phosphoric acid aqueous solution inside the phosphoric acid tank, a liquid amount decreasing step of, when the silicon concentration of the phosphoric acid aqueous solution inside the phosphoric acid tank reaches an upper limit value of a specified concentration range, decreasing a liquid amount of the phosphoric acid aqueous solution inside the phosphoric acid tank to a value not more than a lower limit value of a specified liquid amount range by drawing off the phosphoric acid aqueous solution from the phosphoric acid tank and/or decreasing an amount of the phosphoric acid aqueous solution returning to the phosphoric acid tank, and a phosphoric acid replenishing step of, when the liquid amount of the phosphoric acid aqueous solution inside the phosphoric acid tank decreases to the value not more than the lower limit value of the specified liquid amount range in the liquid amount decreasing process, increasing the liquid amount of the phosphoric acid aqueous solution inside the phosphoric acid tank to a value within the specified liquid amount range and decreasing the silicon concentration of the phosphoric acid aqueous solution inside the phosphoric acid tank to a value within the specified concentration range by replenishing a phosphoric acid aqueous solution to the phosphoric acid tank from a phosphoric acid replenishing unit differing from the phosphoric acid recovery unit.

With this arrangement, the phosphoric acid aqueous solution stored in the phosphoric acid tank is guided to the phosphoric acid nozzle and made to be discharged by the phosphoric acid nozzle. The phosphoric acid aqueous solution discharged from the phosphoric acid nozzle lands on the front surface (upper surface or lower surface) of the rotating substrate and flows outward along the front surface of the substrate. Thereby, the phosphoric acid aqueous solution is supplied to the entire front surface of the substrate and the silicon nitride film is selectively etched.

The phosphoric acid aqueous solution supplied to the substrate is recovered to the phosphoric acid tank by the phosphoric acid recovery unit. Silicon, contained in the substrate, is dissolved in the recovered phosphoric acid aqueous solution. Therefore, if the supplying of the phosphoric acid aqueous solution to the substrate is continued, the silicon concentration of the phosphoric acid aqueous solution inside the phosphoric acid tank increases. The silicon concentration of the phosphoric acid aqueous solution inside the phosphoric acid tank is detected by a silicon concentration meter.

When the silicon concentration of the phosphoric acid aqueous solution inside the phosphoric acid tank reaches the upper limit value of the specified concentration range, the liquid amount of the phosphoric acid aqueous solution inside the phosphoric acid tank is decreased. That is, at least one of the phosphoric acid aqueous solution inside the phosphoric acid tank and the phosphoric acid aqueous solution returning to the phosphoric acid tank is decreased. These phosphoric acid aqueous solutions are phosphoric acid aqueous solutions that are separate from the phosphoric acid aqueous solution that could not be recovered. When the liquid amount of the phosphoric acid aqueous solution inside the phosphoric acid tank decreases to a value not more than the lower limit value of the specified liquid amount range, the phosphoric acid aqueous solution is replenished to the phosphoric acid tank from the phosphoric acid replenishing unit that is separate from the phosphoric acid recovery unit.

When the phosphoric acid aqueous solution is replenished to the phosphoric acid tank from the phosphoric acid replenishing unit, the liquid amount of the phosphoric acid aqueous solution inside the phosphoric acid tank increases to a value within the specified liquid amount range. Further, the phosphoric acid aqueous solution is add to the phosphoric acid aqueous solution in which the silicon contained in the substrate is dissolved, and therefore the silicon concentration of the phosphoric acid aqueous solution inside the phosphoric acid tank is decreased by the replenishment of the phosphoric acid aqueous solution. The silicon concentration of the phosphoric acid aqueous solution is thereby adjusted to be of a value within the specified concentration range. The silicon concentration of the phosphoric acid aqueous solution supplied to the substrate can thus be stabilized.

Thus, the liquid amount of the phosphoric acid aqueous solution inside the phosphoric acid tank is not decreased by just the amount corresponding to the phosphoric acid aqueous solution that could not be recovered but is decreased intentionally to adjust the silicon concentration of the phosphoric acid aqueous solution. The phosphoric acid aqueous solution replenishing timing and the phosphoric acid aqueous solution replenishing amount can thus be changed intentionally. Further, by changing the liquid amount, etc., of the replenished phosphoric acid aqueous solution, the silicon concentration after the phosphoric acid aqueous solution replenishment can be adjusted. The silicon concentration of the phosphoric acid aqueous solution inside the phosphoric acid tank can thereby be stabilized and the silicon concentration of the phosphoric acid aqueous solution to be supplied to the substrate can be stabilized.

In the preferred embodiment, at least one of the following features may be added to the substrate processing method.

The phosphoric acid replenishing step includes a concentration changing step of changing the silicon concentration of the phosphoric acid aqueous solution replenished to the phosphoric acid tank from the phosphoric acid replenishing unit.

With this arrangement, not just the timing at which the phosphoric acid aqueous solution is replenished to the phosphoric acid tank and the liquid amount of the phosphoric acid aqueous solution replenished to the phosphoric acid tank but the silicon concentration of the phosphoric acid aqueous solution replenished to the phosphoric acid tank can also be changed intentionally. Fluctuation and non-uniformity of temperature that occur immediately after the replenishment of the phosphoric acid aqueous solution can thereby be suppressed. Or, fluctuation and non-uniformity of silicon concentration that occur immediately after the replenishment of the phosphoric acid aqueous solution can be suppressed.

Specifically, by sufficiently decreasing the silicon concentration of the phosphoric acid aqueous solution to be replenished, the silicon concentration of the phosphoric acid aqueous solution inside the phosphoric acid tank can be decreased to a value within the specified concentration range by just replenishing with a small amount of the phosphoric acid aqueous solution. In this case, even if the temperature of the phosphoric acid aqueous solution to be replenished differs from the temperature of the phosphoric acid aqueous solution inside the phosphoric acid tank, fluctuation and non-uniformity of the temperature of the phosphoric acid aqueous solution that occur inside the phosphoric acid tank immediately after the replenishment of the phosphoric acid aqueous solution can be suppressed.

Also, even if the silicon concentration of the phosphoric acid aqueous solution to be replenished is not extremely low, the silicon concentration of the phosphoric acid aqueous solution inside the phosphoric acid tank can be decreased to a value within the specified concentration range by increasing the amount of the replenished phosphoric acid aqueous solution. In this case, the phosphoric acid aqueous solution, which is mostly equal in silicon concentration to the phosphoric acid aqueous solution inside the phosphoric acid tank, is replenished to the phosphoric acid tank and therefore fluctuation and non-uniformity of the silicon concentration that occur immediately after the replenishment of the phosphoric acid aqueous solution can be suppressed.

The phosphoric acid recovery step includes a post-discharge-start recovery step of starting the recovery of the phosphoric acid aqueous solution to the phosphoric acid tank after the discharge of the phosphoric acid aqueous solution from the phosphoric acid nozzle is started in the phosphoric acid discharging process.

With this arrangement, the recovery of the phosphoric acid aqueous solution is started after some time elapses after the discharge of the phosphoric acid aqueous solution is started. Ordinarily, the amount of silicon that dissolves into the phosphoric acid aqueous solution from the substrate is the highest immediately after the supplying of the phosphoric acid aqueous solution to the substrate is started and decreases with the elapse of time. Therefore, by drawing off, to a liquid draw-off piping, the phosphoric acid aqueous solution recovered from the substrate immediately after the supplying of the phosphoric acid aqueous solution is started instead of recovering it to the phosphoric acid tank, an increase in the silicon concentration of the phosphoric acid aqueous solution inside the phosphoric acid tank can be suppressed.

The liquid amount decreasing step includes a recovery amount decreasing step of decreasing the liquid amount of the phosphoric acid aqueous solution returning to the phosphoric acid tank from the substrate when the silicon concentration of the phosphoric acid aqueous solution inside the phosphoric acid tank reaches the upper limit value of the specified concentration range.

With this arrangement, when the silicon concentration of the phosphoric acid aqueous solution inside the phosphoric acid tank reaches the upper limit value of the specified concentration range, some of the phosphoric acid aqueous solution supplied to the substrate is not recovered to the phosphoric acid tank but is drawn off to the liquid draw-off piping. The liquid amount of the phosphoric acid aqueous solution returning to the phosphoric acid tank from the substrate is thereby decreased and the liquid amount of the phosphoric acid aqueous solution inside the phosphoric acid tank decreases. The phosphoric acid aqueous solution supplied to the substrate is increased in silicon concentration. The liquid amount of the phosphoric acid aqueous solution inside the phosphoric acid tank can thus be decreased while suppressing an increase in the silicon concentration of the phosphoric acid aqueous solution inside the phosphoric acid tank.

The phosphoric acid storing step includes a step of putting the phosphoric acid aqueous solution in contact with a liquid contacting portion, made of quartz, of the phosphoric acid tank.

With this arrangement, the phosphoric acid tank is provided with the liquid contacting portion that contacts the phosphoric acid aqueous solution. At least a portion of the liquid contacting portion is made of quartz. Silicon that is contained in the quartz dissolves into the phosphoric acid aqueous solution inside the phosphoric acid tank. The silicon concentration of the phosphoric acid aqueous solution inside the phosphoric acid tank thus increases, not only during processing, when the phosphoric acid aqueous solution supplied to the substrate is recovered to the phosphoric acid tank, but also during non-processing when the phosphoric acid aqueous solution is not supplied to the substrate. When the silicon concentration of the phosphoric acid aqueous solution inside the phosphoric acid tank reaches the upper limit value of the specified concentration range during non-processing, the liquid amount of the phosphoric acid aqueous solution inside the phosphoric acid tank is decreased intentionally and the phosphoric acid aqueous solution is replenished to the phosphoric acid tank. The silicon concentration of the phosphoric acid aqueous solution inside the phosphoric acid tank can thus be stabilized during non-processing as well.

The substrate processing method further includes a phosphoric acid heating step of heating, by a heater, the phosphoric acid aqueous solution before the phosphoric acid aqueous solution is supplied to the phosphoric acid nozzle, and the phosphoric acid heating step includes a step of putting the phosphoric acid aqueous solution in contact with a liquid contacting portion, made of quartz, of the heater.

With this arrangement, the heater is provided with the liquid contacting portion that contacts the phosphoric acid aqueous solution. At least a portion of the liquid contacting portion is made of quartz. Silicon that is contained in the quartz dissolves into the phosphoric acid aqueous solution before it is supplied to the substrate. When the silicon concentration of the phosphoric acid aqueous solution inside the phosphoric acid tank reaches the upper limit value of the specified concentration range during non-processing, the liquid amount of the phosphoric acid aqueous solution inside the phosphoric acid tank is decreased intentionally and the phosphoric acid aqueous solution is replenished to the phosphoric acid tank. The silicon concentration of the phosphoric acid aqueous solution inside the phosphoric acid tank can thus be stabilized during non-processing as well.

Another preferred embodiment of the present invention provides a substrate processing apparatus that supplies a phosphoric acid aqueous solution containing silicon to a substrate including a front surface at which a silicon oxide film and a silicon nitride film are exposed to selectively etch the silicon nitride film. The substrate processing apparatus includes a substrate holding unit that rotates the substrate around a vertical rotation axis passing through a central portion of the substrate while holding the substrate horizontally, a phosphoric acid nozzle that discharges the phosphoric acid aqueous solution toward the front surface of the substrate held by the substrate holding unit, a phosphoric acid tank that stores the phosphoric acid aqueous solution to be discharged from the phosphoric acid nozzle, a phosphoric acid guiding unit that guides the phosphoric acid aqueous solution from the phosphoric acid tank to the phosphoric acid nozzle, a phosphoric acid recovery unit that recovers the phosphoric acid aqueous solution, supplied from the phosphoric acid nozzle to the substrate, to the phosphoric acid tank, a phosphoric acid replenishing unit that is differing from the phosphoric acid recovery unit and maintains a liquid amount of the phosphoric acid aqueous solution inside the phosphoric acid tank within a specified liquid amount range by replenishing a phosphoric acid aqueous solution to the phosphoric acid tank, a liquid amount decreasing unit that decreases the liquid amount of the phosphoric acid aqueous solution inside the phosphoric acid tank by drawing off the phosphoric acid aqueous solution from the phosphoric acid tank and/or decreasing an amount of the phosphoric acid aqueous solution returning to the phosphoric acid tank, a silicon concentration meter that detects a silicon concentration of the phosphoric acid aqueous solution inside the phosphoric acid tank, and a controller that controls the substrate processing apparatus.

The controller executes a phosphoric acid storing step of making the phosphoric acid tank store the phosphoric acid aqueous solution to be supplied to the substrate, a phosphoric acid guiding step of making the phosphoric acid guiding unit guide the phosphoric acid aqueous solution from the phosphoric acid tank to the phosphoric acid nozzle, a phosphoric acid discharging step of making the phosphoric acid nozzle discharge the phosphoric acid aqueous solution toward the front surface of the substrate, a substrate rotating step of making the substrate holding unit rotate the substrate around the rotation axis in parallel to the phosphoric acid discharging process, a phosphoric acid recovery step of making the phosphoric acid recovery unit recover the phosphoric acid aqueous solution, which has been supplied to the substrate from the phosphoric acid nozzle, to the phosphoric acid tank, a concentration detecting step of making the silicon concentration meter detect the silicon concentration of the phosphoric acid aqueous solution inside the phosphoric acid tank, a liquid amount decreasing step of making the liquid amount decreasing unit decrease the liquid amount of the phosphoric acid aqueous solution inside the phosphoric acid tank to a value not more than a lower limit value of the specified liquid amount range when the silicon concentration of the phosphoric acid aqueous solution inside the phosphoric acid tank reaches an upper limit value of a specified concentration range, and a phosphoric acid replenishing step of making the phosphoric acid replenishing unit replenish the phosphoric acid aqueous solution to the phosphoric acid tank to increase the liquid amount of the phosphoric acid aqueous solution inside the phosphoric acid tank to a value within the specified liquid amount range and decrease the silicon concentration of the phosphoric acid aqueous solution inside the phosphoric acid tank to a value within the specified concentration range when the liquid amount of the phosphoric acid aqueous solution inside the phosphoric acid tank decreases to the value not more than the lower limit value of the specified liquid amount range in the liquid amount decreasing process. With this arrangement, the same effects as the effects described above can be exhibited.

In the preferred embodiment, at least one of the following features may be added to the substrate processing apparatus.

The phosphoric acid replenishing unit includes a concentration changing unit that changes the silicon concentration of the phosphoric acid aqueous solution to be replenished to the phosphoric acid tank, and the phosphoric acid replenishing step includes a concentration changing step of making the concentration changing unit change the silicon concentration of the phosphoric acid aqueous solution to be replenished to the phosphoric acid tank. With this arrangement, the same effects as the effects described above can be exhibited.

The phosphoric acid recovery step includes a post-discharge-start recovery step of making the phosphoric acid recovery unit start the recovery of the phosphoric acid aqueous solution to the phosphoric acid tank after the discharge of the phosphoric acid aqueous solution from the phosphoric acid nozzle is started in the phosphoric acid discharging process. With this arrangement, the same effects as the effects described above can be exhibited.

The phosphoric acid recovery unit includes a cylindrical processing cup that receives the phosphoric acid aqueous solution scattering from the substrate held by the substrate holding unit, and a recovery piping that guides the phosphoric acid aqueous solution inside the processing cup to the phosphoric acid tank, the liquid amount decreasing unit includes a liquid draw-off piping that draws off the phosphoric acid aqueous solution from at least one of the processing cup and the recovery piping, and a recovery/liquid draw-off switching valve that switches among a plurality of states including a recovery state, where the phosphoric acid aqueous solution received by the processing cup returns to the phosphoric acid tank via the recovery piping, and a liquid draw-off state, where the phosphoric acid aqueous solution received by the processing cup is drawn off to the liquid draw-off piping, and the liquid amount decreasing step includes a recovery amount decreasing step of switching the recovery/liquid draw-off switching valve from the recovery state to the liquid draw-off state to decrease the liquid amount of the phosphoric acid aqueous solution returning from the substrate to the phosphoric acid tank when the silicon concentration of the phosphoric acid aqueous solution inside the phosphoric acid tank reaches the upper limit value of the specified concentration range.

With this arrangement, the phosphoric acid aqueous solution scattered from the substrate is received by the processing cup. When the recovery/liquid draw-off switching valve is in the recovery state, the phosphoric acid aqueous solution received by the processing cup is guided to the phosphoric acid tank by the recovery piping. When the recovery/liquid draw-off switching valve is in the liquid draw-off state, the phosphoric acid aqueous solution received by the processing cup is drawn off to the liquid draw-off piping without being recovered to the phosphoric acid tank. Therefore, when the recovery/liquid draw-off switching valve is in the liquid draw-off state, the liquid amount of the phosphoric acid aqueous solution returning from the processing cup to the phosphoric acid tank decreases.

When the phosphoric acid aqueous solution is supplied to the substrate, the silicon contained in the substrate dissolves into the phosphoric acid aqueous solution and the silicon concentration increases. The phosphoric acid aqueous solution received by the processing cup is the phosphoric acid aqueous solution supplied to the substrate and is therefore increased in silicon concentration. When this phosphoric acid aqueous solution is recovered to the phosphoric acid tank, the silicon concentration of the phosphoric acid aqueous solution inside the phosphoric acid tank increases. Therefore, by drawing off the phosphoric acid aqueous solution to be recovered from the processing cup to the phosphoric acid tank to the liquid draw-off piping, such an increase in the silicon concentration can be prevented and fluctuation of the silicon concentration can be suppressed.

The phosphoric acid tank includes a liquid contacting portion, made of quartz, that contacts the phosphoric acid aqueous solution. With this arrangement, the same effects as the effects described above can be exhibited.

The substrate processing apparatus further includes a heater that heats the phosphoric acid aqueous solution before the phosphoric acid aqueous solution is supplied to the phosphoric acid nozzle, and the heater includes a liquid contacting portion, made of quartz, that contacts the phosphoric acid aqueous solution. With this arrangement, the same effects as the effects described above can be exhibited.

The above and other objects, features, and effects of the present invention will become more apparent from the following detailed description of the preferred embodiments with reference to the attached drawings.

BRIEF DESCRIPTION OF THE DRAWINGS

FIG. 7A is a time chart showing change with time of a silicon concentration of a phosphoric acid aqueous solution inside a phosphoric acid tank and change with time of a liquid amount inside the phosphoric acid tank.

FIG. 7B is a time chart showing the change with time of the silicon concentration of the phosphoric acid aqueous solution inside the phosphoric acid tank and the change with time of the liquid amount inside the phosphoric acid tank.

DETAILED DESCRIPTION OF PREFERRED EMBODIMENTS

Figure 1:
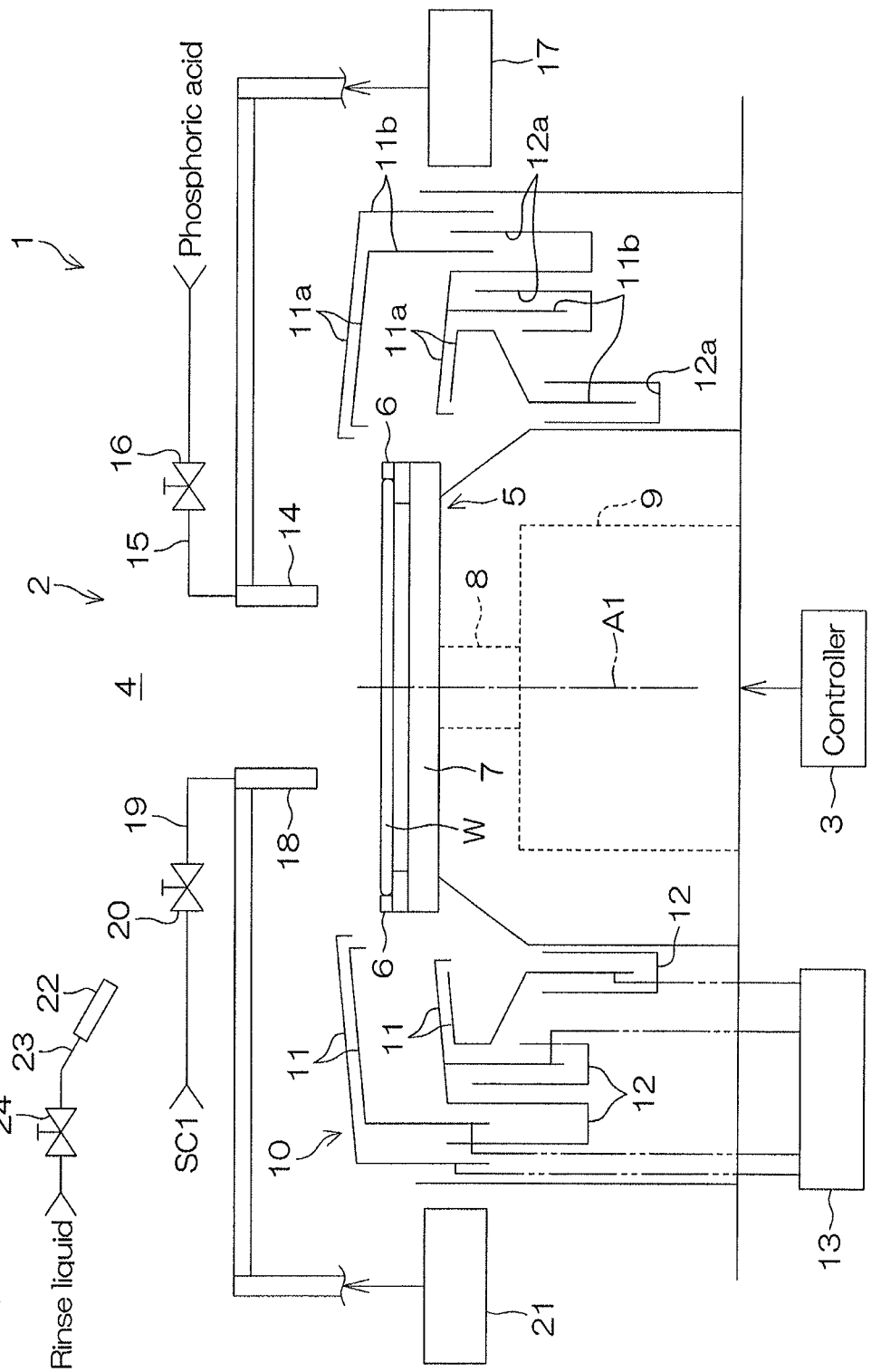
FIG. 1 is a schematic view of a processing unit included in a substrate processing apparatus according to a preferred embodiment of the invention, viewed horizontally.

FIG. 1 is a schematic view of a processing unit 2 included in a substrate processing apparatus 1 according to a preferred embodiment of the invention, viewed horizontally.

The substrate processing apparatus 1 is a single substrate processing type apparatus that processes a disk-shaped substrate W such as a semiconductor wafer one by one. The substrate processing apparatus 1 includes a plurality of processing units 2 that process substrates W using a processing fluid such as a processing liquid or processing gas, a transfer robot (not shown) that transports the substrates W to the plurality of processing units 2, and a controller 3 that controls the substrate processing apparatus 1.

The processing unit 2 includes a spin chuck 5 that rotates the substrate W around a vertical rotation axis A1 passing through a central portion of the substrate W while holding the substrate W horizontally inside a chamber 4 and a tubular processing cup 10 that receives the processing liquid scattered outward from the substrate W.

The spin chuck 5 includes a disk-shaped spin base 7 that is held in a horizontal orientation, a plurality of chuck pins 6 that hold the substrate W in a horizontal orientation above the spin base 7, a spin shaft 8 that extends downward from a central portion of the spin base 7, and a spin motor 9 that rotates the spin shaft 8 to rotate the spin base 7 and the plurality of chuck pins 6. The spin chuck 5 is not restricted to a clamping type chuck, with which the plurality of chuck pins 6 are put in contact with an outer peripheral surface of the substrate W, and may be a vacuum type chuck with which a rear surface (lower surface) of the substrate W that is a non-device forming surface is suctioned onto an upper surface of the spin base 7 to hold the substrate W horizontally.

The processing cup 10 includes a plurality of guards 11, receiving liquid drawn off outward from the substrate W, and a plurality of cups 12, receiving liquid guided downward by the guard 11. Each guard 11 includes a cylindrical portion 11*b* of circular cylindrical shape, surrounding the spin chuck 5, and a ceiling portion 11*a* of circular annular shape, extending obliquely upward toward the rotation axis A1 from an upper end portion of the cylindrical portion 11*b*. The plurality of ceiling portions 11*a* overlap in an up-down direction and the plurality of cylindrical portions 11*b* are disposed concentrically. The plurality of cups 12 are disposed respectively below the plurality of cylindrical portions 11*b*. The cups 12 define upwardly-open, annular liquid receiving grooves 12*a*. The processing cup 10, the guards 11, and the cups 12 are an example of a phosphoric acid recovery unit.

The processing unit 2 includes a guard raising/lowering unit 13 that raises and lowers the plurality of guards 11 individually. The guard raising/lowering unit 13 raises and lowers each guard 11 vertically between an upper position and a lower position. The upper position is a position at which an upper end of the guard 11 is positioned higher than a substrate holding position at which the spin chuck 5 holds the substrate W. The lower position is a position at which the upper end of the guard 11 is positioned lower than the substrate holding position. Circular annular upper ends of the ceiling portions 11*a* correspond to being the upper ends of the guards 11. The upper ends of the guards 11 surround the substrate W and the spin base 7 in plan view.

When in a state where the spin chuck 5 is rotating the substrate W, a processing liquid is supplied to the substrate W, the processing liquid supplied to the substrate W is spun off to a periphery of the substrate W. When the processing liquid is supplied to the substrate W, the upper end of at least one guard 11 is disposed higher than the substrate W. The processing liquid, such as a chemical liquid or a rinse liquid, etc., that is drawn off to the periphery of the substrate W is thus received by one of the guard 11 and is guided to the cup 12 corresponding to the guard 11.

The processing unit 2 includes a phosphoric acid nozzle 14 that discharges a phosphoric acid aqueous solution downward toward an upper surface of the substrate W. The phosphoric acid nozzle 14 is an example of a first chemical liquid nozzle that discharges the phosphoric acid aqueous solution, which is an example of a first chemical liquid. The phosphoric acid nozzle 14 is connected to a phosphoric acid piping 15 that guides the phosphoric acid aqueous solution. When a phosphoric acid valve 16, interposed in the phosphoric acid piping 15, is opened, the phosphoric acid aqueous solution is discharged continuously downward from a discharge port of the phosphoric acid nozzle 14.

The phosphoric acid aqueous solution is an aqueous solution having phosphoric acid ($H_3PO_4$) as a main constituent. A concentration of phosphoric acid in the phosphoric acid aqueous solution is, for example, in a range of 50% to 100% and is preferably around 90%. A boiling point of the phosphoric acid aqueous solution differs according to the phosphoric acid concentration in the phosphoric acid aqueous solution and is generally within a range of 140° C. to 195° C. The phosphoric acid aqueous solution contains silicon. A concentration of silicon in the phosphoric acid aqueous solution is, for example, 15 to 150 ppm and preferably 40 to 60 ppm. The silicon contained in the phosphoric acid aqueous solution may be elemental silicon or a silicon compound or both elemental silicon and a silicon compound. Also, the silicon contained in the phosphoric acid aqueous solution may be silicon that was eluted from the substrate W due to supplying of the phosphoric acid aqueous solution or may be silicon that was added to the phosphoric acid aqueous solution.

While not shown, the phosphoric acid valve 16 includes a valve body that defines a flow passage, a valve element that is disposed in the flow passage, and an actuator that moves the valve element. The same applies to valves described below. The actuator may be a pneumatic actuator or an electric actuator or an actuator besides these. The controller 3 changes an opening degree of the phosphoric acid valve 16 by controlling the actuator.

The phosphoric acid nozzle 14 is a scan nozzle that is movable inside the chamber 4. The phosphoric acid nozzle 14 is connected to a first nozzle moving unit 17 that moves the phosphoric acid nozzle 14 in at least one of a vertical direction and a horizontal direction. The first nozzle moving unit 17 moves the phosphoric acid nozzle 14 horizontally between a processing position, at which the phosphoric acid aqueous solution discharged from the phosphoric acid nozzle 14 lands on the upper surface of the substrate W, and a retracted position, at which the phosphoric acid nozzle 14 is positioned at a periphery of the spin chuck 5 in plan view.

The processing unit 2 includes an SC1 nozzle 18 that discharges SC1 (a mixed solution containing $NH_4OH$ and $H_2O_2$) downward toward the upper surface of the substrate W. The SC1 nozzle 18 is an example of a second chemical liquid nozzle that discharges the SC1, which is an example of a second chemical liquid. The SC1 nozzle 18 is connected to an SC1 piping 19 that guides the SC1. When an SC1 valve 20, interposed in the SC1 piping 19, is opened, the SC1 is discharged continuously downward from a discharge port of the SC1 nozzle 18.

The SC1 nozzle 18 is a scan nozzle that is movable inside the chamber 4. The SC1 nozzle 18 is connected to a second nozzle moving unit 21 that moves the SC1 nozzle 18 in at least one of a vertical direction and a horizontal direction. The second nozzle moving unit 21 moves the SC1 nozzle 18 horizontally between a processing position, at which the SC1 discharged from the SC1 nozzle 18 lands on the upper surface of the substrate W, and a retracted position, at which the SC1 nozzle 18 is positioned at a periphery of the spin chuck 5 in plan view.

The processing unit 2 includes a rinse liquid nozzle 22 that discharges a rinse liquid downward toward the upper surface of the substrate W. The rinse liquid nozzle 22 is connected to a rinse liquid piping 23 that guides the rinse liquid. When a rinse liquid valve 24, interposed in the rinse liquid piping 23, is opened, the rinse liquid is discharged continuously downward from a discharge port of the rinse liquid nozzle 22. The rinse liquid is, for example, pure water (deionized water). The rinse liquid is not limited to pure water, and may be any of electrolyzed ionic water, hydrogen water, ozone water, and hydrochloric acid water of dilute concentration (for example, about 10 to 100 ppm).

The rinse liquid nozzle 22 is a fixed nozzle that discharges the rinse liquid with a discharge port of the rinse liquid nozzle 22 being in a stationary state. The rinse liquid nozzle 22 is fixed with respect to a bottom portion of the chamber 4. The processing unit 2 may include a nozzle moving unit that moves the rinse liquid nozzle 22 horizontally between a processing position, at which the rinse liquid discharged from the rinse liquid nozzle 22 lands on the upper surface of the substrate W, and a retracted position, at which the rinse liquid nozzle 22 is positioned at a periphery of the spin chuck 5 in plan view. The spin chuck 5 is an example of a substrate holding unit.

Figure 2:
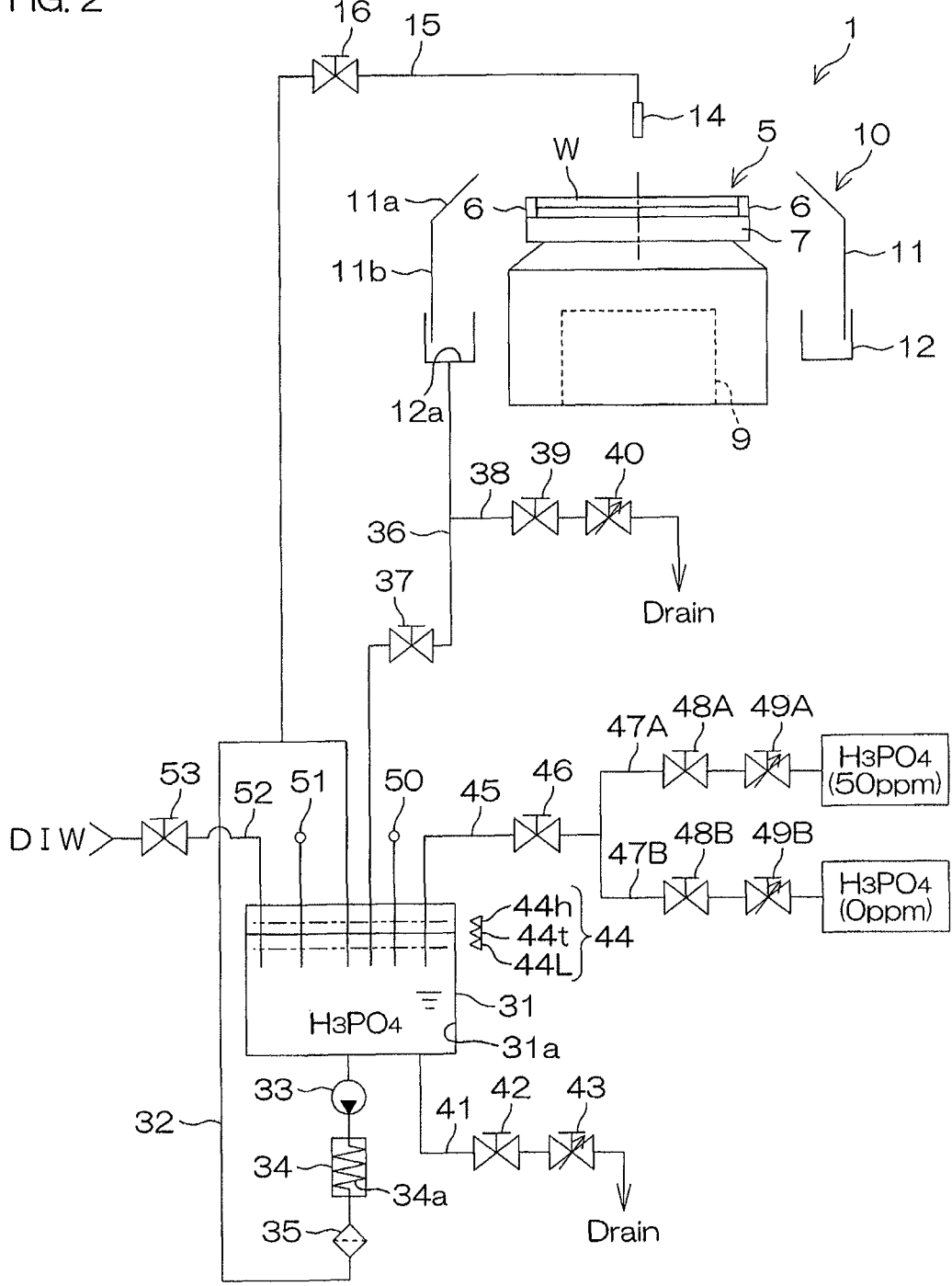
FIG. 2 is a schematic view of a phosphoric acid supplying system, etc., included in the substrate processing apparatus.

FIG. 2 is a schematic view of a phosphoric acid supplying system, etc., included in the substrate processing apparatus 1.

The phosphoric acid supplying system of the substrate processing apparatus 1 includes a phosphoric acid tank 31 that stores the phosphoric acid aqueous solution discharged from the phosphoric acid nozzle 14 and a circulation piping 32 that makes the phosphoric acid aqueous solution inside the phosphoric acid tank 31 circulate. The phosphoric acid supplying system further includes a pump 33 that feeds the phosphoric acid aqueous solution inside the phosphoric acid tank 31 to the circulation piping 32, a heater 34 that heats the phosphoric acid aqueous solution in an annular circulation passage defined by the phosphoric acid tank 31 and the circulation piping 32, and a filter 35 that removes foreign matter from the phosphoric acid aqueous solution flowing inside the circulation piping 32.

The pump 33, the filter 35, and the heater 34 are interposed in the circulation piping 32. The phosphoric acid piping 15, guiding the phosphoric acid aqueous solution to the phosphoric acid nozzle 14, is connected to the circulation piping 32. The pump 33 constantly feeds the phosphoric acid aqueous solution inside the phosphoric acid tank 31 to the circulation piping 32. The phosphoric acid supplying system may include, in place of the pump 33, a pressurizing apparatus that increases an air pressure inside the phosphoric acid tank 31 to push out the phosphoric acid aqueous solution inside the phosphoric acid tank 31 into the circulation piping 32. The pump 33 and the pressurizing apparatus are both examples of a liquid feeding apparatus that feeds the phosphoric acid aqueous solution inside the phosphoric acid tank 31 into the circulation piping 32. The phosphoric acid piping 15, the circulation piping 32, and the pump 33 are an example of a phosphoric acid guiding unit.

An upstream end and a downstream end of the circulation piping 32 are connected to the phosphoric acid tank 31. The phosphoric acid aqueous solution is fed into the upstream end of the circulation piping 32 from the phosphoric acid tank 31 and returns to the phosphoric acid tank 31 from the downstream end of the circulation piping 32. The phosphoric acid aqueous solution inside the phosphoric acid tank 31 is thereby circulated in the circulation passage. While the phosphoric acid aqueous solution is being circulated in the circulation passage, foreign matter contained in the phosphoric acid aqueous solution is removed by the filter 35 and the phosphoric acid aqueous solution is heated by the heater 34. The phosphoric acid aqueous solution inside the phosphoric acid tank 31 is thereby maintained at a constant temperature higher than room temperature (for example, 20 to 30° C.). The temperature of the phosphoric acid aqueous solution heated by the heater 34 may be the boiling point at that concentration or may be temperature less than the boiling point.

A recovery system of the substrate processing apparatus 1 includes, in addition to the processing cup 10, a recovery piping 36, guiding the phosphoric acid aqueous solution received by the processing cup 10 to the phosphoric acid tank 31, and a recovery valve 37, opening and closing the recovery piping 36. The recovery piping 36 and the recovery valve 37 are an example of the phosphoric acid recovery unit. A liquid draw-off system of the substrate processing apparatus 1 includes a liquid draw-off piping 38, connected to the processing cup 10 or the recovery piping 36, a liquid draw-off valve 39, opening and closing the liquid draw-off piping 38, and a liquid draw-off flow control valve 40, changing a flow rate of the phosphoric acid aqueous solution drawn off to the liquid draw-off piping 38. In FIG. 2, the liquid draw-off piping 38 is connected to the recovery piping 36 at a portion upstream the recovery valve 37. The liquid draw-off piping 38, the liquid draw-off valve 39, and the liquid draw-off flow control valve 40 are an example of a liquid amount decreasing unit. The recovery valve 37 and the liquid draw-off valve 39 constitute an example of a recovery/liquid draw-off switching valve.

The recovery/liquid draw-off switching valve includes the recovery valve 37 and the liquid draw-off valve 39. The recovery/liquid draw-off valve may include a three-way valve, disposed at a connection position of the recovery piping 36 and the liquid draw-off piping 38, in place of the recovery valve 37 and the liquid draw-off valve 39. In a recovery state in which the recovery valve 37 is opened and the liquid draw-off valve 39 is closed, the phosphoric acid aqueous solution that is received by the processing cup 10 is recovered to the phosphoric acid tank 31 by the recovery piping 36. In a liquid draw-off state in which the recovery valve 37 is closed and the liquid draw-off valve 39 is opened, the phosphoric acid aqueous solution received by the processing cup 10 is drawn off to the liquid draw-off piping 38 at a flow rate corresponding to an opening degree of the liquid draw-off flow control valve 40.

A drain system of the substrate processing apparatus 1 includes a drain piping 41, drawing off the phosphoric acid aqueous solution inside the phosphoric acid tank 31, a drain valve 42, interposed in the drain piping 41, and a drain flow control valve 43, changing a flow rate of the phosphoric acid aqueous solution drawn off to the drain piping 41. The drain piping 41, the drain valve 42, and the drain flow control valve 43 are an example of the liquid amount decreasing unit. When the drain valve 42 is opened, the phosphoric acid aqueous solution inside the phosphoric acid tank 31 is drawn off to the drain piping 41 at a flow rate corresponding to an opening degree of the drain flow control valve 43. A liquid amount of the phosphoric acid aqueous solution inside the phosphoric acid tank 31 is thereby decreased. The liquid amount of the phosphoric acid aqueous solution inside the phosphoric acid tank 31 is detected by a plurality of liquid amount sensors 44.

The plurality of liquid amount sensors 44 include an upper limit sensor 44h, detecting whether or not the liquid amount of the phosphoric acid aqueous solution inside the phosphoric acid tank 31 is less than an upper limit value of a specified liquid amount range, a lower limit sensor 44L, detecting whether or not the liquid amount of the phosphoric acid aqueous solution inside the phosphoric acid tank 31 is less than a lower limit value of the specified liquid amount range, and a target sensor 44t, detecting whether or not the liquid amount of the phosphoric acid aqueous solution inside the phosphoric acid tank 31 is less than a target value in between the upper limit value and the lower limit value. When the liquid amount of the phosphoric acid aqueous solution inside the phosphoric acid tank 31 decreases to the lower limit value of the specified liquid amount range, an unused, fresh phosphoric acid aqueous solution is replenished to the phosphoric acid tank 31 from a replenishing system of the substrate processing apparatus 1. The liquid amount of the phosphoric acid aqueous solution inside the phosphoric acid tank 31 is thereby maintained at a value within the specified liquid amount range.

The replenishing system of the substrate processing apparatus 1 replenishes, to the phosphoric acid tank 31, a phosphoric acid aqueous solution, which differs from the phosphoric acid aqueous solution recovered by the above-described recovery system. In the following description, the phosphoric acid aqueous solution replenished by the replenishing system shall be referred to as the unused phosphoric acid aqueous solution or the fresh phosphoric acid aqueous solution to distinguish it from the phosphoric acid aqueous solution recovered by the recovery system. The replenishing system is a system that is separate from the recovery system.

The replenishing system includes a replenishing piping 45, supplying an unused phosphoric acid aqueous solution to the phosphoric acid tank 31, and a replenishing valve 46, opening and closing the replenishing piping 45. The replenishing system further includes a first individual piping 47A, supplying an unused phosphoric acid aqueous solution of a first silicon concentration to the replenishing piping 45, and a second individual piping 47B, supplying an unused phosphoric acid aqueous solution of a second silicon concentration to the replenishing piping 45. A first replenishing valve 48A and a first replenishment flow control valve 49A are interposed in the first individual piping 47A. A second replenishing valve 48B and a second replenishment flow control valve 49B are interposed in the second individual piping 47B. The replenishing piping 45, the replenishing valve 46, the first individual piping 47A, the second individual piping 47B, the first replenishing valve 48A, the second replenishing valve 48B, the first replenishment flow control valve 49A and the second replenishment flow control valve 49B are an example of a phosphoric acid replenishing unit. The first replenishment flow control valve 49A and the second replenishment flow control valve 49B are an example of a concentration changing unit.

The first silicon concentration is greater in value than the second silicon concentration. The first silicon concentration is, for example, of a value equal to the silicon concentration of the phosphoric acid aqueous solution inside the phosphoric acid tank 31 before the circulation and heating of the phosphoric acid aqueous solution is started. The first silicon concentration is, for example 50 ppm and the second silicon concentration is, for example, 0 ppm. Both the first individual piping 47A and the second individual piping 47B supply the phosphoric acid aqueous solutions to the replenishing piping 45. The replenishing system may include a fresh solution heater that heats the unused phosphoric acid aqueous solution replenished to the phosphoric acid tank 31.

When the first replenishing valve 48A is opened, the phosphoric acid aqueous solution of the first silicon concentration is supplied to the replenishing piping 45. Similarly, when the second replenishing valve 48B is opened, the phosphoric acid aqueous solution of the second silicon concentration is supplied to the replenishing piping 45. When both the first replenishing valve 48A and the second replenishing valve 48B are opened, a phosphoric acid aqueous solution of a silicon concentration in between the first silicon concentration and the second silicon concentration is replenished to the phosphoric acid tank 31. The liquid amount and the silicon concentration of the phosphoric acid aqueous solution replenished to the phosphoric acid tank 31 are adjusted by opening degrees of the first replenishment flow control valve 49A and the second replenishment flow control valve 49B.

The phosphoric acid supplying system includes a silicon concentration meter 50, detecting the silicon concentration of the phosphoric acid aqueous solution inside the phosphoric acid tank 31, a phosphoric acid concentration meter 51, detecting the phosphoric acid concentration of the phosphoric acid aqueous solution inside the phosphoric acid tank 31, a water supplying piping 52, supplying pure water to the phosphoric acid tank 31, and a water supplying valve 53, interposed in the water supplying piping 52. The heater 34 heats the phosphoric acid aqueous solution at a temperature not less than the boiling point of water. When the water contained in the phosphoric acid aqueous solution evaporates, the concentration of the phosphoric acid in the phosphoric acid aqueous solution increases. The controller 3 opens the water supplying valve 53 based on a detection value of the phosphoric acid concentration meter 51 to replenish pure water to the phosphoric acid tank 31. The concentration of the phosphoric acid in the phosphoric acid aqueous solution is thereby maintained within a specified concentration range.

Figure 3:
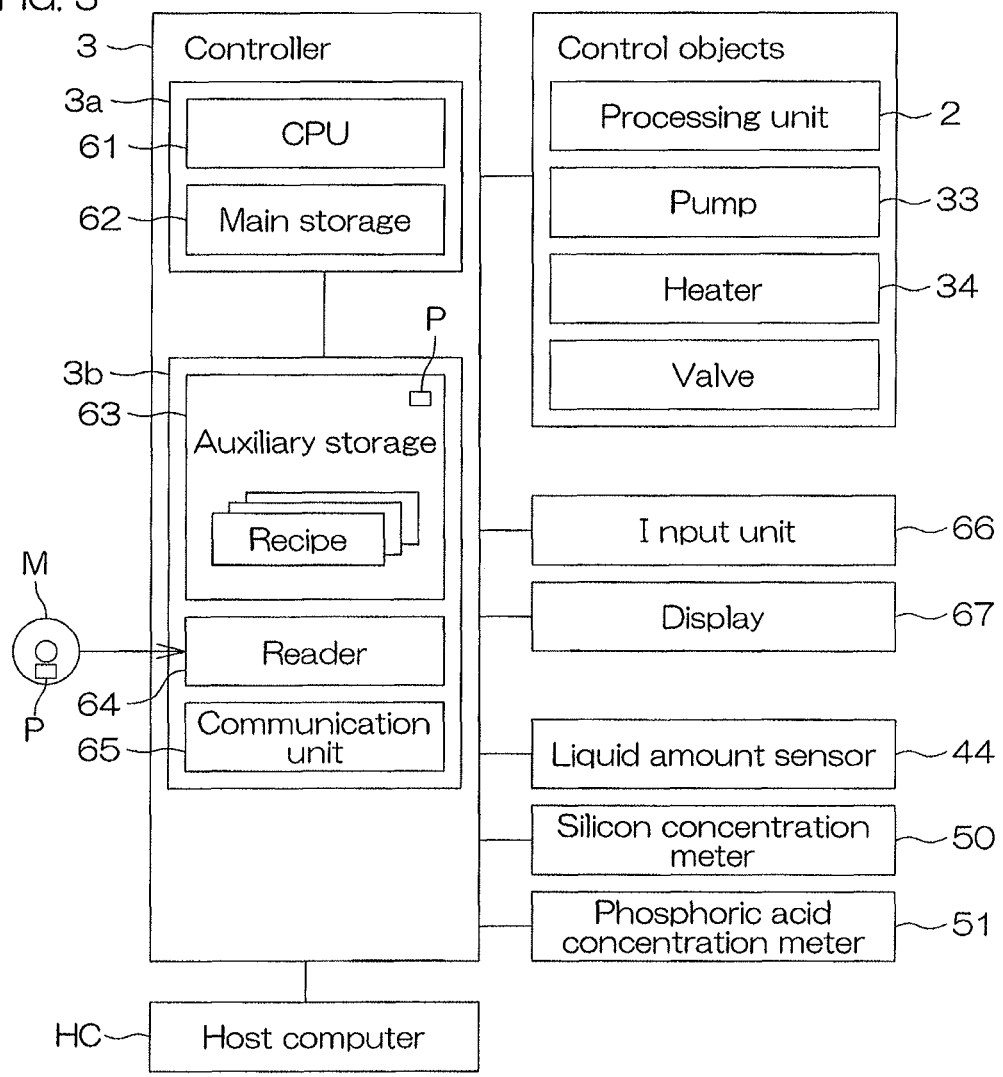
FIG. 3 is a block diagram showing an electrical configuration of the substrate processing apparatus.

FIG. 3 is a block diagram showing an electrical configuration of the substrate processing apparatus 1.

The controller 3 includes a computer main body 3a and a peripheral unit 3b, connected to the computer main body 3a. The computer main body 3a includes a CPU 61 (central processing unit) that executes various instructions and a main storage 62 that stores information. The peripheral unit 3b includes an auxiliary storage 63, storing information of a program P, etc., a reader 64, reading information from a removable medium M, and a communication unit 65, communicating with a host computer HC or other unit besides the controller 3.

The controller 3 is connected to an input unit 66 and a display 67. The input unit 66 is operated when an operator, such as a user or a maintenance staff, etc., inputs information into the substrate processing apparatus 1. The information is displayed on a screen of the display 67. The input unit 66 may be any of a keyboard, a pointing device, and a touch panel or may be a unit besides these. The substrate processing apparatus 1 may be provided with a touch panel display that serves as both the input unit 66 and the display 67.

The CPU 61 executes the program P stored in the auxiliary storage 63. The program P inside the auxiliary storage 63 may be one that is installed in advance in the controller 3 or may be one that is sent from the removable medium M to the auxiliary storage 63 through the reader 64 or may be one that is sent from the host computer HC or other external unit to the auxiliary storage 63 through the communication unit 65.

Each of the auxiliary storage 63 and the removable medium M is a nonvolatile memory, with which stored contents are held even if electrical power is not supplied. The auxiliary storage 63 is, for example, a magnetic storage, such as a hard disk drive, etc. The removable medium M is, for example, an optical disk, such as a compact disk, etc., or a semiconductor memory, such as a memory card, etc. The removable medium M is an example of computer readable storage medium storing the program P.

The controller 3 controls the substrate processing apparatus 1 such that the substrate W is processed in accordance with a recipe designated by the host computer HC. The auxiliary storage 63 stores a plurality of recipes. Each recipe is information specifying processing contents, processing conditions, and processing procedures for the substrate W. The plurality of recipes differ from each other in at least one of the processing contents, the processing conditions, and the processing procedures for the substrate W. The following respective processes are executed by the controller 3 controlling the substrate processing apparatus 1. In other words, the controller 3 is programed to execute the following respective processes.

Figure 4:
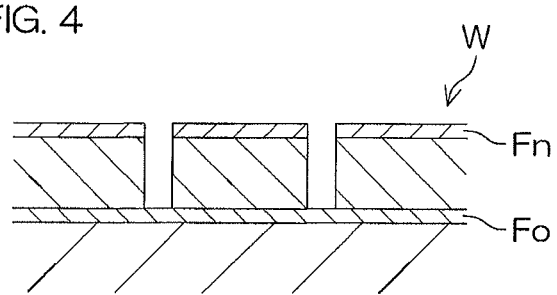
FIG. 4 is a sectional view showing an example of across section of a substrate to be processed by the substrate processing apparatus.
Figure 5:
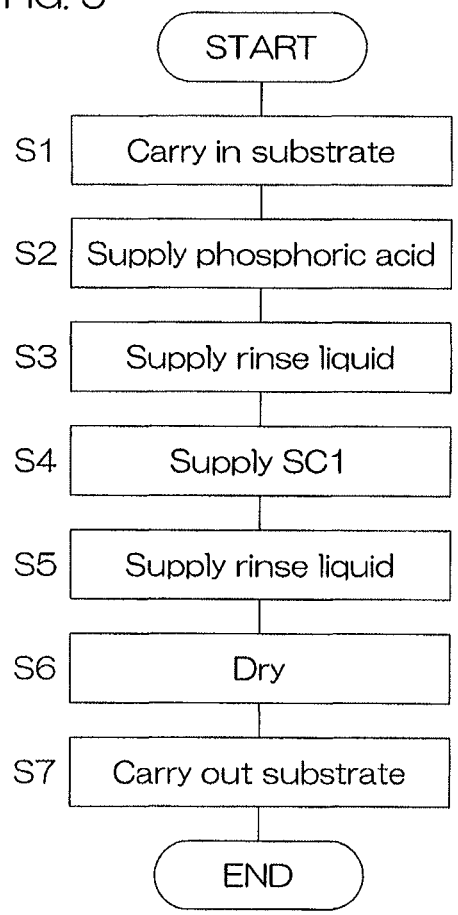
FIG. 5 is a process flowchart for describing an example of processing of the substrate performed by the substrate processing apparatus.

FIG. 4 is a sectional view showing an example of a cross section of the substrate W to be processed by the substrate processing apparatus 1. FIG. 5 is a process flowchart for describing an example of processing of the substrate W performed by the substrate processing apparatus 1. FIG. 1, FIG. 4, and FIG. 5 shall be referenced in the description that follows.

As shown in FIG. 4, an example of the substrate W processed by the substrate processing apparatus 1 is a silicon wafer having a front surface (device forming surface) at which a silicon oxide film Fo ($SiO_2$) and a silicon nitride film Fn (SiN) are exposed. In the example of processing of the substrate W described below, the phosphoric acid aqueous solution is supplied to such a substrate W. The silicon nitride film Fn can thereby be etched at a predetermined etching rate (etching amount per unit time) while suppressing etching of the silicon oxide film Fo.

When the substrate W is to be processed by the substrate processing apparatus 1, a carry-in step of carrying the substrate W into the chamber 4 is performed (step S1 of FIG. 5).

Specifically, in a state where all of the nozzle are retracted from above the substrate W and all of the guards 11 are positioned at the lower positions, a transfer robot (not shown) makes a hand enter into the chamber 4 while supporting the substrate W with the hand. Thereafter, in a state where the front surface of the substrate W is faced upward, the transfer robot places the substrate W, on the hand, on the spin chuck 5. Thereafter, the transfer robot retracts the hand from the interior of the chamber 4. After the substrate W is gripped by the chuck pins 6, the spin motor 9 starts rotating substrate W.

Next, a phosphoric acid supplying step of supplying the phosphoric acid aqueous solution to the substrate W is performed (step S2 of FIG. 5).

Specifically, the first nozzle moving unit 17 moves the phosphoric acid nozzle 14 to the processing position and the guard raising/lowering unit 13 makes one of the guards 11 face the substrate W. Thereafter, the phosphoric acid valve 16 is opened and the phosphoric acid nozzle 14 starts discharge of the phosphoric acid aqueous solution. While the phosphoric acid nozzle 14 is discharging the phosphoric acid aqueous solution, the first nozzle moving unit 17 may move the phosphoric acid nozzle 14 between a central processing position, at which the phosphoric acid aqueous solution discharged from the phosphoric acid nozzle 14 lands on an upper surface central portion of the substrate W, and an outer peripheral processing position, at which the phosphoric acid aqueous solution discharged from the phosphoric acid nozzle 14 lands on an upper surface outer peripheral portion of the substrate W, or may keep the phosphoric acid nozzle 14 still such that a liquid landing position of the phosphoric acid aqueous solution is positioned at the upper surface central position of the substrate W.

The phosphoric acid aqueous solution discharged from the phosphoric acid nozzle 14 lands on the upper surface of the substrate W and thereafter flows outward along the upper surface of the rotating substrate W. A liquid film of the phosphoric acid aqueous solution that covers the entire upper surface of the substrate W is thereby formed and the phosphoric acid aqueous solution is supplied to the entire upper surface of the substrate W. Especially when the first nozzle moving unit 17 moves the phosphoric acid nozzle 14 between the central processing position and the outer peripheral processing position, the entire upper surface of the substrate W is scanned by the liquid landing position of the phosphoric acid aqueous solution and therefore the phosphoric acid aqueous solution is supplied uniformly to the entire upper surface of the substrate W. The upper surface of the substrate W is thereby processed uniformly. When a predetermined time elapses from when the phosphoric acid valve 16 is opened, the phosphoric acid valve 16 is closed and the discharge of the phosphoric acid aqueous solution from the phosphoric acid nozzle 14 is stopped. Thereafter, the first nozzle moving unit 17 moves the phosphoric acid nozzle 14 to the retracted position.

Next, a first rinse liquid supplying step of supplying pure water, which is an example of the rinse liquid, to the upper surface of the substrate W is performed (step S3 of FIG. 5).

Specifically, the rinse liquid valve 24 is opened and the rinse liquid nozzle 22 starts discharge of the pure water. The pure water that lands on the upper surface of the substrate W flows outward along the upper surface of the rotating substrate W. The phosphoric acid aqueous solution on the substrate W is rinsed off by the pure water discharged from the rinse liquid nozzle 22. A liquid film of the pure water that covers the entire upper surface of the substrate W is thereby formed. When a predetermined time elapses from when the rinse liquid valve 24 is opened, the rinse liquid valve 24 is closed and the discharge of pure water is stopped.

Next, an SC1 supplying step of supplying the SC1 to the substrate W is performed (step S4 of FIG. 5).

Specifically, the second nozzle moving unit 21 moves the SC1 nozzle 18 to the processing position and the guard raising/lowering unit 13 makes a guard 11, differing from that in the phosphoric acid supplying process, face the substrate W. Thereafter, the SC1 valve 20 is opened and the SC1 nozzle 18 starts discharge of the SC1. While the SC1 nozzle 18 is discharging the SC1, the second nozzle moving unit 21 may move the SC1 nozzle 18 between a central processing position, at which the SC1 discharged from the SC1 nozzle 18 lands on the upper surface central portion of the substrate W, and an outer peripheral processing position, at which the SC1 discharged from the SC1 nozzle 18 lands on the upper surface outer peripheral portion of the substrate W, or may keep the SC1 nozzle 18 still such that a liquid landing position of the SC1 is positioned at the upper surface central position of the substrate W.

The SC1 discharged from the SC1 nozzle 18 lands on the upper surface of the substrate W and thereafter flows outward along the upper surface of the rotating substrate W. A liquid film of the SC1 that covers the entire upper surface of the substrate W is thereby formed and the SC1 is supplied to the entire upper surface of the substrate W. Especially when the second nozzle moving unit 21 moves the SC1 nozzle 18 between the central processing position and the outer peripheral processing position, the entire upper surface of the substrate W is scanned by the liquid landing position of the SC1 and therefore the SC1 is supplied uniformly to the entire upper surface of the substrate W. The upper surface of the substrate W is thereby processed uniformly. When a predetermined time elapses from when the SC1 valve 20 is opened, the SC1 valve 20 is closed and the discharge of the SC1 from the SC1 nozzle 18 is stopped. Thereafter, the second nozzle moving unit 21 moves the SC1 nozzle 18 to the retracted position.

Next, a second rinse liquid supplying step of supplying pure water, which is an example of the rinse liquid, to the upper surface of the substrate W is performed (step S5 of FIG. 5).

Specifically, the rinse liquid valve 24 is opened and the rinse liquid nozzle 22 starts discharge of the pure water. The pure water that lands on the upper surface of the substrate W flows outward along the upper surface of the rotating substrate W. The SC1 on the substrate W is rinsed off by the pure water discharged from the rinse liquid nozzle 22. A liquid film of the pure water that covers the entire upper surface of the substrate W is thereby formed. When a predetermined time elapses from when the rinse liquid valve 24 is opened, the rinse liquid valve 24 is closed and the discharge of pure water is stopped.

Next, a drying step of drying the substrate W by high-speed rotation of the substrate W is performed (step S6 of FIG. 5).

Specifically, the spin motor 9 accelerates the substrate W in a rotation direction and rotates the substrate W at a rotational speed (for example, of several thousand rpm) greater than a rotational speed of the substrate W thus far. The liquid is thus removed from the substrate W and the substrate W dries. When a predetermined time elapses from when the high-speed rotation of the substrate W is started, the rotation of the spin motor 9 is stopped. The rotation of the substrate W is thereby stopped.

Next, a carry-out step of carrying the substrate W out from the chamber 4 is performed (step S7 of FIG. 5).

Specifically, the guard elevating/lowering unit 13 lowers all of the guards 11 to the lower positions. Thereafter, the transfer robot (not shown) makes the hand enter into the chamber 4. After the holding of the substrate W by the plurality of chuck pins 6 is released, the transfer robot supports the substrate W on the spin chuck 5 with the hand. Thereafter, the transfer robot retracts the hand from the interior of the chamber 4 while supporting the substrate W with the hand. The processed substrate W is thereby carried out from the chamber 4.

Figure 6:
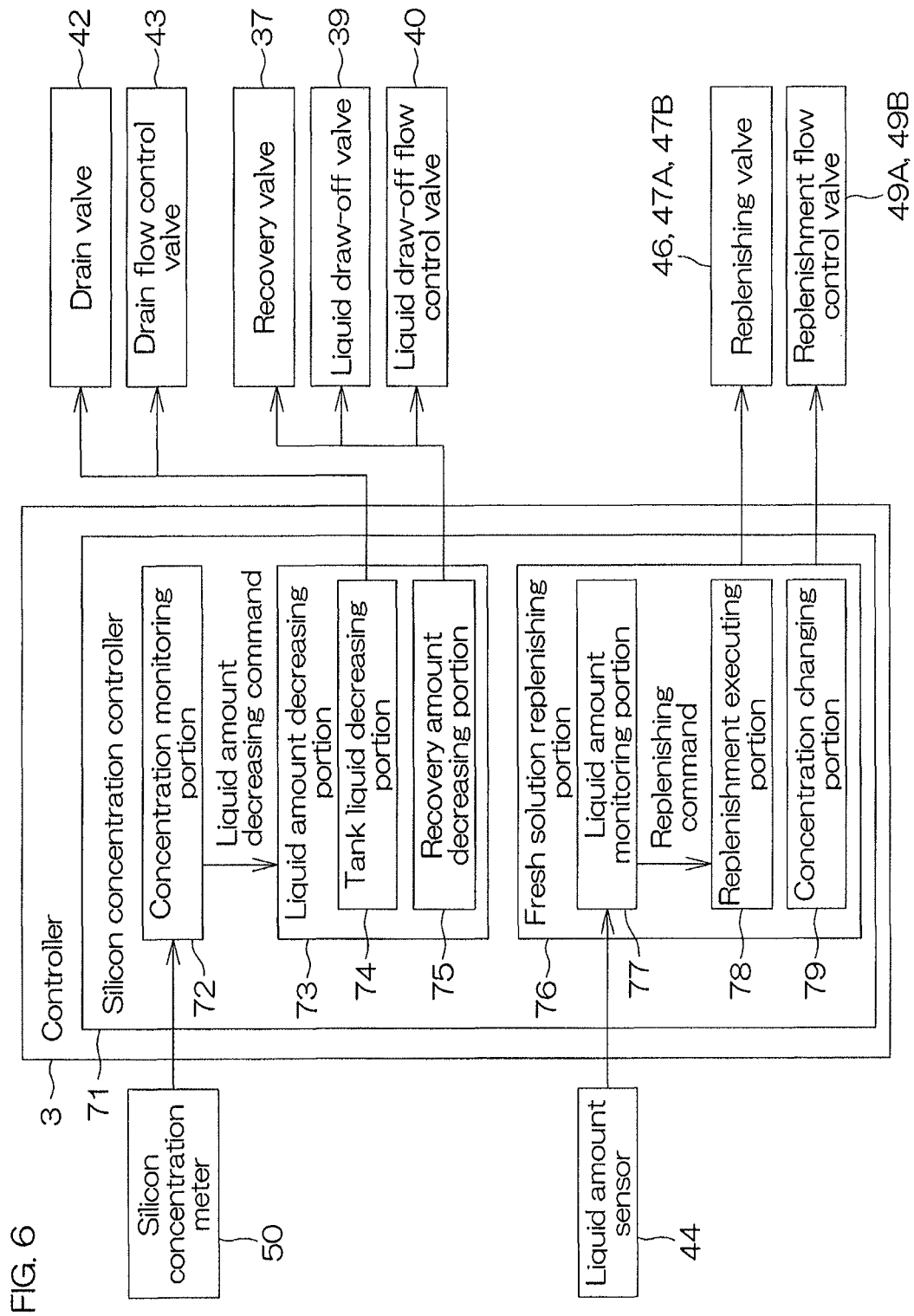
FIG. 6 is a block diagram showing functional blocks of a controller.

FIG. 6 is a block diagram showing functional blocks of the controller 3. FIG. 2, FIG. 3, and FIG. 6 shall be referenced in the description that follows.

The controller 3 includes a silicon concentration controller 71 that stabilizes the silicon concentration of the phosphoric acid aqueous solution inside the phosphoric acid tank 31. The silicon concentration controller 71 is a function block that is realized by the CPU 61 executing the program P installed in the controller 3.

The silicon concentration controller 71 includes a concentration monitoring portion 72, monitoring the silicon concentration of the phosphoric acid aqueous solution inside the phosphoric acid tank 31 based on a detection value of the silicon concentration meter 50, a liquid amount decreasing portion 73, decreasing the liquid amount of the phosphoric acid aqueous solution inside the phosphoric acid tank 31 to a value not more than the lower limit value of the specified liquid amount range in accordance with a liquid amount decreasing command from the concentration monitoring portion 72, and a fresh solution replenishing portion 76, replenishing the unused, fresh phosphoric acid aqueous solution to the phosphoric acid tank 31 to increase the liquid amount of the phosphoric acid aqueous solution inside the phosphoric acid tank 31 to a value within the specified liquid amount range.

The liquid amount decreasing portion 73 includes a tank liquid decreasing portion 74, opening and closing the drain valve 42 to lessen the liquid inside the phosphoric acid tank 31, and a recovery amount decreasing portion 75, opening and closing the recovery valve 37 and the liquid draw-off valve 39 to decrease the liquid amount of the phosphoric acid aqueous solution recovered from the cup 12 to the phosphoric acid tank 31. The opening degree of the drain flow control valve 43 is changed by the tank liquid decreasing portion 74, and the opening degree of the liquid draw-off flow control valve 40 is changed by the recovery amount decreasing portion 75.

The fresh solution replenishing portion 76 includes a liquid amount monitoring portion 77, monitoring the liquid amount of the phosphoric acid aqueous solution inside the phosphoric acid tank 31 based on detection value of the liquid amount sensors 44, a replenishment executing portion 78, opening the replenishing valve 46 in accordance with a replenishing command from the liquid amount monitoring portion 77 to replenish the phosphoric acid aqueous solution to the phosphoric acid tank 31, and a concentration changing portion 79, changing the opening degrees of the first replenishment flow control valve 49A and the second replenishment flow control valve 49B to change the silicon concentration of the phosphoric acid aqueous solution replenished to the phosphoric acid tank 31.

If, in a case where the liquid amount of the phosphoric acid aqueous solution replenished to the phosphoric acid tank 31 is the same, the silicon concentration of the phosphoric acid aqueous solution to be replenished is changed, a change amount of the silicon concentration of the phosphoric acid aqueous solution inside the phosphoric acid tank 31 before and after the replenishment of the phosphoric acid aqueous solution also changes. The silicon concentration controller can thus change the change amount of the silicon concentration of the phosphoric acid aqueous solution inside the phosphoric acid tank 31 before and after the replenishment of the phosphoric acid aqueous solution by making the fresh solution replenishing portion 76 change the silicon concentration of the replenishment phosphoric acid aqueous solution.

FIG. 7A and FIG. 7B are time charts showing change with time of the silicon concentration of the phosphoric acid aqueous solution inside the phosphoric acid tank 31 and change with time of the liquid amount of the phosphoric acid aqueous solution inside the phosphoric acid tank 31. FIG. 7B shows a portion in continuation of FIG. 7A. FIG. 2, FIG. 6, and FIG. 7A and FIG. 7B shall be referenced in the description that follows.

When the phosphoric acid valve 16 is opened (time T1 of FIG. 7A), the phosphoric acid aqueous solution inside the phosphoric acid tank 31 is fed to the phosphoric acid nozzle 14 and discharged from the phosphoric acid nozzle 14 toward the substrate W. The recovery valve 37 may be opened before or after the phosphoric acid valve 16 is opened or may be opened at the same time that the phosphoric acid valve 16 is opened. FIG. 7A shows an example where the recovery valve 37 is opened after the phosphoric acid valve 16 is opened (time T2 of FIG. 7A). The liquid draw-off valve 39 is closed when the recovery valve 37 is opened and is opened when the recovery valve 37 is closed.

When the recovery valve 37 is open, the phosphoric acid aqueous solution supplied to the substrate W is recovered to the phosphoric acid tank 31. When the phosphoric acid aqueous solution is supplied to the substrate W, silicon contained in the substrate W dissolves into the phosphoric acid aqueous solution and the silicon concentration increases. When this phosphoric acid aqueous solution is recovered to the phosphoric acid tank 31, the silicon concentration of the phosphoric acid aqueous solution inside the phosphoric acid tank 31 increases. The concentration monitoring portion 72 of the controller 3 monitors the silicon concentration of the phosphoric acid aqueous solution inside the phosphoric acid tank 31 based on the detection value of the silicon concentration meter 50.

When the silicon concentration of the phosphoric acid aqueous solution inside the phosphoric acid tank 31 reaches an upper limit value of the specified concentration range (time T3 of FIG. 7A), the concentration monitoring portion 72 transmits the liquid amount decreasing command, for decreasing the liquid amount of the phosphoric acid aqueous solution inside the phosphoric acid tank 31, to the liquid amount decreasing portion 73 of the controller 3. Upon receiving the liquid amount decreasing command, the liquid amount decreasing portion 73 decreases the liquid amount of the phosphoric acid aqueous solution inside the phosphoric acid tank 31 to a value not more than the lower limit value of the specified liquid amount range (time T3 to time T5). FIG. 7A shows an example where the liquid amount of the phosphoric acid aqueous solution inside the phosphoric acid tank 31 is decreased by drawing off the phosphoric acid aqueous solution inside the phosphoric acid tank 31 to the drain piping 41. In this case, the liquid amount decreasing portion 73 opens the drain valve 42 for a predetermined time (time T3 to time T5).

When the drain valve 42 is opened, the liquid amount of the phosphoric acid aqueous solution inside the phosphoric acid tank 31 decreases. When the liquid amount of the phosphoric acid aqueous solution inside the phosphoric acid tank 31 reaches the lower limit value of the specified liquid amount range (time T4 of FIG. 7A), the fresh solution replenishing portion 76 of the controller 3 opens the replenishing valve 46 (time T4 of FIG. 7A) and the unused, fresh phosphoric acid aqueous solution is replenished to the phosphoric acid tank 31. At this time, the recovery valve 37 and the drain valve 42 are also opened. Therefore, whereas the phosphoric acid aqueous solution supplied to the substrate W and the unused, fresh phosphoric acid aqueous solution are supplied to the phosphoric acid tank 31, some of the phosphoric acid aqueous solution inside the phosphoric acid tank 31 is drawn off to the drain piping 41.

If the flow rate of the phosphoric acid aqueous solution drawn off to the drain piping 41 is greater than a flow rate of the phosphoric acid aqueous solution replenished to the phosphoric acid tank 31, a rate of a decrease in the liquid amount of the phosphoric acid aqueous solution inside the phosphoric acid tank 31 would be gradual. FIG. 7A illustrates this example. If oppositely, the flow rate of the phosphoric acid aqueous solution drawn off to the drain piping 41 is less than the flow rate of the phosphoric acid aqueous solution replenished to the phosphoric acid tank 31, the liquid amount of the phosphoric acid aqueous solution inside the phosphoric acid tank 31 would increase. If the two are equal, the liquid amount inside the phosphoric acid tank 31 would be maintained substantially constant.

When the liquid amount of the phosphoric acid aqueous solution inside the phosphoric acid tank 31 reaches the target value between the upper limit value and the lower limit value, the fresh solution replenishing portion 76 closes the replenishing valve 46 (time T6 of FIG. 7A) and the replenishment of the phosphoric acid aqueous solution is stopped. The liquid amount of the phosphoric acid aqueous solution inside the phosphoric acid tank 31 is thus restored to a value within the specified liquid amount range. Further, the unused phosphoric acid aqueous solution replenished to the phosphoric acid tank 31 is lower in silicon concentration than the phosphoric acid aqueous solution inside the phosphoric acid tank 31 and therefore the phosphoric acid aqueous solution inside the phosphoric acid tank 31 decreases in silicon concentration while the unused phosphoric acid aqueous solution is being replenished to the phosphoric acid tank 31 (time T4 to time T6 of FIG. 7A). The silicon concentration of the phosphoric acid aqueous solution inside the phosphoric acid tank 31 is thereby decreased to a value within the specified concentration range (time T6 of FIG. 7A).

After the replenishing valve 46 is closed at the time T6 of FIG. 7A, whereas the phosphoric acid aqueous solution supplied to the substrate W continues to be recovered, the replenishment of the phosphoric acid aqueous solution is stopped and therefore the silicon concentration of the phosphoric acid aqueous solution inside the phosphoric acid tank 31 continues to increase again. When the silicon concentration of the phosphoric acid aqueous solution reaches the upper limit value of the specified concentration range (time T7 of FIG. 7A), the drawing off of the phosphoric acid aqueous solution and the replenishment of the phosphoric acid aqueous solution are performed in the same manner as described above (time T7 to time T8 of FIG. 7A). Fluctuation of the silicon concentration of the phosphoric acid aqueous solution supplied to the substrate W can thereby be suppressed.

When a predetermined time elapses from when the phosphoric acid valve 16 is opened, the phosphoric acid valve 16 is closed (time T9 of FIG. 7B), and the discharge of the phosphoric acid aqueous solution from the phosphoric acid nozzle 14 is stopped. Thereafter, the recovery valve 37 is closed and the liquid draw-off valve 39 is opened (time T10 of FIG. 7B). When the discharge of the phosphoric acid aqueous solution stops, no more phosphoric acid aqueous solution is returned from the cup 12 to the phosphoric acid tank 31. However, the silicon contained in the phosphoric acid tank 31 and the heater 34 dissolves into the phosphoric acid aqueous solution inside the phosphoric acid tank 31 and therefore the silicon concentration of the phosphoric acid aqueous solution inside the phosphoric acid tank 31 continues to increase at a smaller proportion than thus far (time T10 to time T11 of FIG. 7B).

When the silicon concentration of the phosphoric acid aqueous solution inside the phosphoric acid tank 31 reaches the upper limit value of the specified concentration range when the supplying of the phosphoric acid aqueous solution to the substrate W is stopped, the drawing off of the phosphoric acid aqueous solution and the replenishment of the phosphoric acid aqueous solution are performed in the same manner as described above (time T11 to time T12 of FIG. 7B). The silicon concentration of the phosphoric acid aqueous solution inside the phosphoric acid tank 31 is thus maintained within the specified concentration range not just during processing, when the phosphoric acid aqueous solution supplied to the substrate W is recovered to the phosphoric acid tank 31, but also during non-processing when the phosphoric acid aqueous solution is not supplied to the substrate W.

As described above, with the present preferred embodiment, the phosphoric acid aqueous solution stored in the phosphoric acid tank 31 is guided to the phosphoric acid nozzle 14 and made to be discharged by the phosphoric acid nozzle 14. The phosphoric acid aqueous solution discharged from the phosphoric acid nozzle 14 lands on the front surface of the rotating substrate W and flows outward along the front surface of the substrate W. Thereby the phosphoric acid aqueous solution is supplied to the entire front surface of the substrate W and the silicon nitride film is selectively etched.

The phosphoric acid aqueous solution supplied to the substrate W is recovered to the phosphoric acid tank 31. The silicon contained in the substrate W is dissolved in the recovered phosphoric acid aqueous solution. Therefore, if the supplying of the phosphoric acid aqueous solution to the substrate W is continued, the silicon concentration of the phosphoric acid aqueous solution inside the phosphoric acid tank 31 increases. The silicon concentration of the phosphoric acid aqueous solution inside the phosphoric acid tank 31 is detected by the silicon concentration meter 50.

When the silicon concentration of the phosphoric acid aqueous solution inside the phosphoric acid tank 31 reaches the upper limit value of the specified concentration range, the liquid amount of the phosphoric acid aqueous solution inside the phosphoric acid tank 31 is decreased. That is, at least one of the phosphoric acid aqueous solution inside the phosphoric acid tank 31 and the phosphoric acid aqueous solution returning to the phosphoric acid tank 31 is decreased. These phosphoric acid aqueous solutions are phosphoric acid aqueous solutions that are separate from the phosphoric acid aqueous solution that could not be recovered. When the liquid amount of the phosphoric acid aqueous solution inside the phosphoric acid tank 31 decreases to a value not more than the lower limit value of the specified liquid amount range, the unused, fresh phosphoric acid aqueous solution is replenished to the phosphoric acid tank 31.

When the fresh phosphoric acid aqueous solution is replenished to the phosphoric acid tank 31, the liquid amount of the phosphoric acid aqueous solution inside the phosphoric acid tank 31 increases to a value within the specified liquid amount range. Further, the phosphoric acid aqueous solution, in which the silicon contained in the substrate W is dissolved, is added with the fresh phosphoric acid aqueous solution, and therefore the silicon concentration of the phosphoric acid aqueous solution inside the phosphoric acid tank 31 is decreased by the replenishment of the phosphoric acid aqueous solution. The silicon concentration of the phosphoric acid aqueous solution inside the phosphoric acid tank 31 is thereby adjusted to be of a value within the specified concentration range. The silicon concentration of the phosphoric acid aqueous solution supplied to the substrate W can thus be stabilized.

Thus, the liquid amount of the phosphoric acid aqueous solution inside the phosphoric acid tank 31 is not decreased by just the amount corresponding to the phosphoric acid aqueous solution that could not be recovered but is decreased intentionally to adjust the silicon concentration of the phosphoric acid aqueous solution. A phosphoric acid aqueous solution replenishing timing and a phosphoric acid aqueous solution replenishing amount can thus be changed intentionally. Further, by changing the liquid amount, etc., of the replenished phosphoric acid aqueous solution, the silicon concentration of the phosphoric acid aqueous solution after the phosphoric acid aqueous solution replenishment can be adjusted. The silicon concentration of the phosphoric acid aqueous solution inside the phosphoric acid tank 31 can thereby be stabilized and the silicon concentration of the phosphoric acid aqueous solution supplied to the substrate W can be stabilized.

A difference of the upper limit value and the lower limit value of the specified concentration range of the silicon concentration is, for example, approximately 10 to 100 ppm. When the silicon concentration of the phosphoric acid aqueous solution inside the phosphoric acid tank 31 reaches a replacement concentration that is a higher concentration than the upper limit value of the specified concentration range, all of the phosphoric acid aqueous solution inside the phosphoric acid tank 31 is drawn off through the drain piping 41 and replaced by the fresh phosphoric acid aqueous solution. With the present preferred embodiment, a frequency of replacement of the phosphoric acid aqueous solution can be decreased because the silicon concentration of the phosphoric acid aqueous solution can be stabilized. A running cost of the substrate processing apparatus 1 can thereby be reduced.

With the present preferred embodiment, not just the timing at which the phosphoric acid aqueous solution is replenished to the phosphoric acid tank 31 and the liquid amount of the phosphoric acid aqueous solution replenished to the phosphoric acid tank 31 but the silicon concentration of the phosphoric acid aqueous solution replenished to the phosphoric acid tank 31 can also be changed intentionally. Fluctuation and non-uniformity of temperature that occur immediately after the replenishment of the phosphoric acid aqueous solution can thereby be suppressed. Or, fluctuation and non-uniformity of silicon concentration that occur immediately after the replenishment of the phosphoric acid aqueous solution can be suppressed.

Specifically, by sufficiently decreasing the silicon concentration of the phosphoric acid aqueous solution to be replenished, the silicon concentration of the phosphoric acid aqueous solution inside the phosphoric acid tank 31 can be decreased to a value within the specified concentration range by just replenishing with a small amount of the phosphoric acid aqueous solution. In this case, even if the temperature of the phosphoric acid aqueous solution to be replenished differs from the temperature of the phosphoric acid aqueous solution inside the phosphoric acid tank 31, fluctuation and non-uniformity of the temperature of the phosphoric acid aqueous solution that occur inside the phosphoric acid tank 31 immediately after the replenishment of the phosphoric acid aqueous solution can be suppressed.

Also, even if the silicon concentration of the phosphoric acid aqueous solution to be replenished is not extremely low, the silicon concentration of the phosphoric acid aqueous solution inside the phosphoric acid tank 31 can be decreased to a value within the specified concentration range by increasing the amount of the replenished phosphoric acid aqueous solution. In this case, the phosphoric acid aqueous solution, which is mostly equal in silicon concentration to the phosphoric acid aqueous solution inside the phosphoric acid tank 31, is replenished to the phosphoric acid tank 31 and therefore fluctuation and non-uniformity of the silicon concentration that occur immediately after the replenishment of the phosphoric acid aqueous solution can be suppressed.

With the present preferred embodiment, the recovery of the phosphoric acid aqueous solution is started after some time elapses after the discharge of the phosphoric acid aqueous solution is started. Ordinarily, the amount of silicon that dissolves into the phosphoric acid aqueous solution from the substrate W is the highest immediately after the supplying of the phosphoric acid aqueous solution to the substrate W is started and decreases with the elapse of time. Therefore, by drawing off, to the liquid draw-off piping 38, the phosphoric acid aqueous solution recovered from the substrate W immediately after the supplying of the phosphoric acid aqueous solution is started instead of recovering it to the phosphoric acid tank 31, an increase in the silicon concentration of the phosphoric acid aqueous solution inside the phosphoric acid tank 31 can be suppressed.

With the present preferred embodiment, a liquid contacting portion 31a (see FIG. 2) of the phosphoric acid tank 31 and a liquid contacting portion 34a (see FIG. 2) of the heater 34 are made of quartz. Silicon that is contained in the quartz dissolves into the phosphoric acid aqueous solution before it is supplied to the substrate W. The silicon concentration of the phosphoric acid aqueous solution inside the phosphoric acid tank 31 thus increases, not only during processing, when the phosphoric acid aqueous solution supplied to the substrate W is recovered to the phosphoric acid tank 31, but also during non-processing when the phosphoric acid aqueous solution is not supplied to the substrate W. When the silicon concentration of the phosphoric acid aqueous solution inside the phosphoric acid tank 31 reaches the upper limit value of the specified concentration range during non-processing, the liquid amount of the phosphoric acid aqueous solution inside the phosphoric acid tank 31 is decreased intentionally and the fresh phosphoric acid aqueous solution is replenished to the phosphoric acid tank 31. The silicon concentration of the phosphoric acid aqueous solution inside the phosphoric acid tank 31 can thus be stabilized during non-processing as well.

Other Preferred Embodiments

The present invention is not restricted to the contents of the above described preferred embodiments and various modifications are possible.

For example, when the silicon concentration of the phosphoric acid aqueous solution inside the phosphoric acid tank 31 reaches the upper limit value of the specified concentration range, instead of drawing off the phosphoric acid aqueous solution inside the phosphoric acid tank 31 to the drain piping 41, some of the phosphoric acid aqueous solution, which is to be recovered from the processing cup 10 to the phosphoric acid tank 31, may be drawn off to the draw-off piping 38 to decrease the liquid amount of the phosphoric acid aqueous solution inside the phosphoric acid tank 31.

Figure 8:
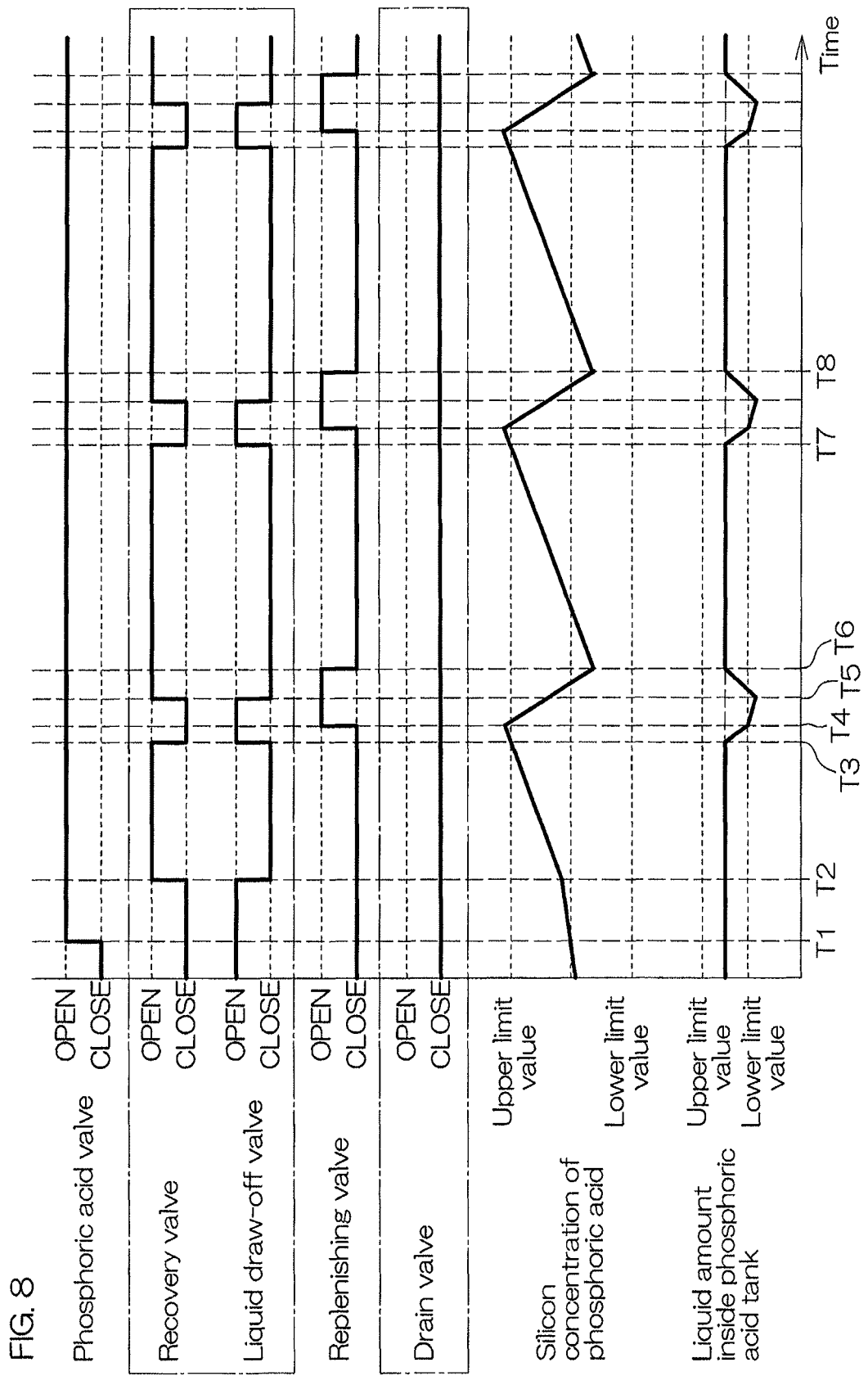
FIG. 8 is a time chart showing the change with time of the silicon concentration of the phosphoric acid aqueous solution inside the phosphoric acid tank and change with time of a liquid amount inside the phosphoric acid tank according to another preferred embodiment of the present invention.

Specifically, as indicated by an alternate long and short dashed line quadrilateral in FIG. 8, the drain valve 42 may be put in the closed state regardless of the silicon concentration of the phosphoric acid aqueous solution and when the silicon concentration of the phosphoric acid aqueous solution inside the phosphoric acid tank 31 reaches the upper limit value of the specified concentration range, the recovery valve 37 may be closed temporarily and the liquid draw-off valve 39 may be opened temporarily.

With this arrangement, the liquid amount of the phosphoric acid aqueous solution inside the phosphoric acid tank 31 is decreased without recovering the phosphoric acid aqueous solution of higher concentration than the phosphoric acid aqueous solution inside the phosphoric acid tank 31, that is, the phosphoric acid aqueous solution supplied to the substrate W to the phosphoric acid tank 31, and therefore the liquid amount of the phosphoric acid aqueous solution inside the phosphoric acid tank 31 can be decreased to a value not more than the lower limit value of the specified liquid amount range while suppressing an increase in the silicon concentration of the phosphoric acid aqueous solution inside the phosphoric acid tank 31.

The liquid draw-off piping 38 may be connected not to the recovery piping 36 but to the cup 12. Also, the liquid draw-off piping 38 may be connected to the circulation piping 32. In this case, some of the phosphoric acid aqueous solution returning to the phosphoric acid tank 31 from the circulation piping 32 can be drawn off to the liquid draw-off piping 38 by opening the liquid draw-off valve 39. The liquid amount of the phosphoric acid aqueous solution inside the phosphoric acid tank 31 can thereby be decreased.

If there is no need to change the silicon concentration of the phosphoric acid aqueous solution replenished to the phosphoric acid tank 31, one of the first individual piping 47A and the second individual piping 47B may be omitted.

With the preferred embodiment described above, the phosphoric acid aqueous solution is replenished to the phosphoric acid tank 31 from the first individual piping 47A and the second individual piping 47B. However, phosphoric acid and water may be replenished individually with respect to the phosphoric acid tank 31 and the replenished phosphoric acid and water may be mixed inside the phosphoric acid tank 31.

The substrate processing apparatus 1 is not restricted to an apparatus that processes a disk-shaped substrate W and may be an apparatus that processes a polygonal substrate W.

Two or more arrangements among all the arrangements described above may be combined. Two or more steps among all the steps described above may be combined.

The present application corresponds to Japanese Patent Application No. 2017-083934 filed on Apr. 20, 2017 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method that supplies a phosphoric acid aqueous solution containing silicon to a substrate including a front surface at which a silicon oxide film and a silicon nitride film are exposed to selectively etch the silicon nitride film, the substrate processing method comprising:

a phosphoric acid storing step of storing the phosphoric acid aqueous solution, to be supplied to the substrate, in a phosphoric acid tank;

a phosphoric acid guiding step of guiding the phosphoric acid aqueous solution from the phosphoric acid tank to a phosphoric acid nozzle;

a phosphoric acid discharging step of making the phosphoric acid nozzle discharge the phosphoric acid aqueous solution toward the front surface of the substrate;

a substrate rotating step of rotating the substrate around a vertical rotation axis, passing through a central portion of the substrate, while holding the substrate horizontally in parallel to the phosphoric acid discharging process;

a phosphoric acid recovery step, starting at a time after the phosphoric acid aqueous solution was first supplied to the substrate from the phosphoric acid nozzle, of recovering to the phosphoric acid tank the phosphoric acid aqueous solution, that has been supplied to the substrate, by a phosphoric acid recovery unit, without also recovering to the phosphoric acid tank the phosphoric acid aqueous solution that was first supplied to the substrate;

a concentration detecting step of detecting a silicon concentration of the phosphoric acid aqueous solution inside the phosphoric acid tank;

a liquid amount decreasing step of, when the silicon concentration of the phosphoric acid aqueous solution inside the phosphoric acid tank reaches an upper limit value of a specified concentration range, decreasing a liquid amount of the phosphoric acid aqueous solution inside the phosphoric acid tank to a value not more than a lower limit value of a specified liquid amount range by decreasing an amount of the phosphoric acid aqueous solution returning to the phosphoric acid tank; and a phosphoric acid replenishing step of, when the liquid amount of the phosphoric acid aqueous solution inside the phosphoric acid tank decreases to the value not more than the lower limit value of the specified liquid amount range in the liquid amount decreasing process, increasing the liquid amount of the phosphoric acid aqueous solution inside the phosphoric acid tank to a value within the specified liquid amount range and decreasing the silicon concentration of the phosphoric acid aqueous solution inside the phosphoric acid tank to a value within the specified concentration range by replenishing a phosphoric acid aqueous solution to the phosphoric acid tank from a phosphoric acid replenishing unit differing from the phosphoric acid recovery unit.

2. The substrate processing method according to claim 1, wherein the phosphoric acid replenishing step includes a concentration changing step of changing the silicon concentration of the phosphoric acid aqueous solution to be replenished to the phosphoric acid tank from the phosphoric acid replenishing unit.

3. The substrate processing method according to claim 1, wherein the phosphoric acid storing step includes a step of putting the phosphoric acid aqueous solution in contact with a liquid contacting portion, made of quartz, of the phosphoric acid tank.

4. The substrate processing method according to claim 1, wherein the substrate processing method further comprises a phosphoric acid heating step of heating, by a heater, the phosphoric acid aqueous solution before the phosphoric acid aqueous solution is supplied to the phosphoric acid nozzle, and the phosphoric acid heating step includes a step of putting the phosphoric acid aqueous solution in contact with a liquid contacting portion, made of quartz, of the heater.

* * * * *